(12) United States Patent
Richardson, II et al.

(10) Patent No.: US 9,198,236 B1
(45) Date of Patent: Nov. 24, 2015

(54) SYSTEM AND METHOD FOR CONTROLLING A MULTIPLE-COLOR LIGHTING DEVICE

(71) Applicant: Grote Industries, LLC, Madison, IN (US)

(72) Inventors: George M. Richardson, II, Charlestown, MI (US); Donald L. Gramlich, Jr., Deputy, IN (US); William L. Corwin, Madison, IN (US); James E. Roberts, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 30 days.

(21) Appl. No.: 14/271,566

(22) Filed: May 7, 2014

(51) Int. Cl.
*H01J 1/62* (2006.01)
*H05B 33/06* (2006.01)
*H05B 33/10* (2006.01)

(52) U.S. Cl.
CPC .............. *H05B 33/06* (2013.01); *H05B 33/10* (2013.01)

(58) Field of Classification Search
CPC ........................... H05B 33/06; H01L 2924/00
USPC .................................................. 313/498, 506
See application file for complete search history.

(56) References Cited

U.S. PATENT DOCUMENTS

| | | | |
|---|---|---|---|
| 5,927,845 | A | 7/1999 | Gustafson et al. |
| 6,166,496 | A | 12/2000 | Lys et al. |
| 6,673,292 | B1 | 1/2004 | Gustafson et al. |
| 2007/0115662 | A1 | 5/2007 | Roberts et al. |
| 2010/0109166 | A1 | 5/2010 | Cok et al. |
| 2010/0109575 | A1 | 5/2010 | Ansems et al. |
| 2011/0043105 | A1 | 2/2011 | Cok et al. |
| 2011/0058372 | A1 | 3/2011 | Lerman et al. |
| 2012/0104953 | A1 | 5/2012 | Chobot |
| 2012/0206428 | A1 | 8/2012 | Cok |

FOREIGN PATENT DOCUMENTS

| | | |
|---|---|---|
| CA | 2182548 A1 | 3/1997 |
| CN | 202546449 U | 11/2012 |
| DE | 20309070 U1 | 9/2003 |

OTHER PUBLICATIONS

International Search Report and Written Opinion of the International Searching Authority mailed Jun. 24, 2015 in the corresponding PCT international patent application No. PCT/US2015/021179.

*Primary Examiner* — Vip Patel
(74) *Attorney, Agent, or Firm* — Posz Law Group, PLC

(57) ABSTRACT

A light-emitting structure, comprising: a ground path; a first current path receiving a control current; a first light-emitting element receiving the control current from the first current path and generating light within a first wavelength range based on the control current; a first conductive substrate portion formed over the first light-emitting element, and receiving the control current from the first light-emitting element; a first connection element receiving the first control current from the first conductive substrate; a second current path receiving the control current from the first connection element; a second light-emitting element receiving the first control current from the second current path, and generating light within the first wavelength range based on the control current; a second conductive substrate portion receiving the first control current; and a grounding element receiving the control current from the second substrate portion, and passing the control current to the ground path.

20 Claims, 12 Drawing Sheets

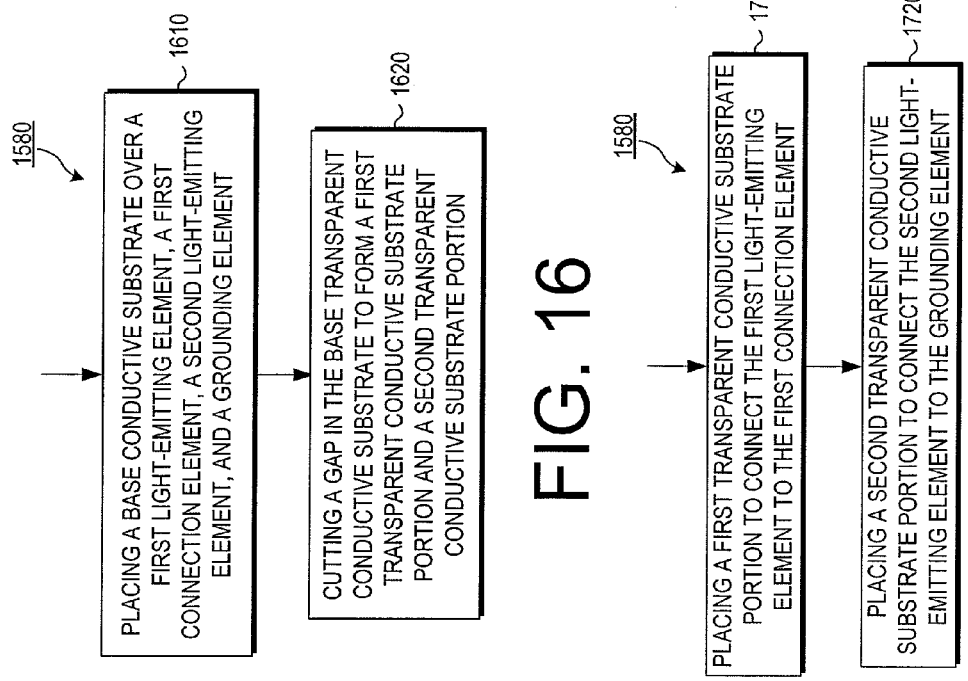
FIG. 16
FIG. 17
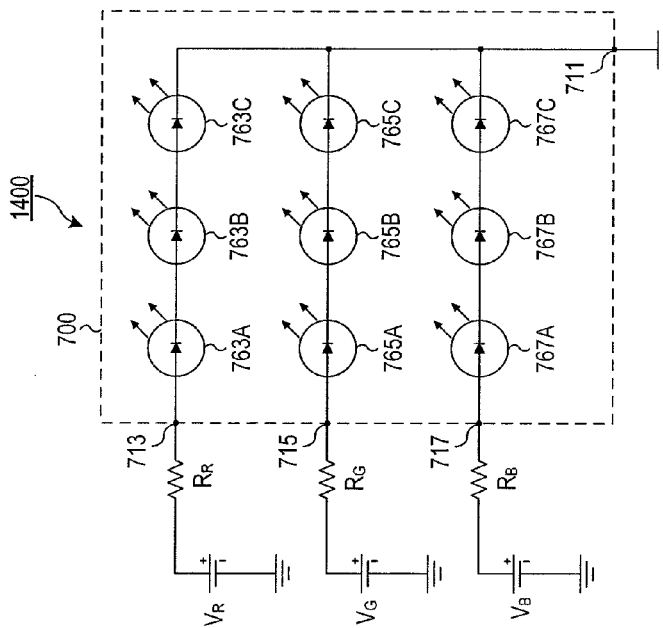
FIG. 14

SYSTEM AND METHOD FOR CONTROLLING A MULTIPLE-COLOR LIGHTING DEVICE

FIELD OF THE INVENTION

The present invention relates generally to a multiple-color lighting device, and more particularly to a multiple-color lighting device in which lights of each individual color can be separately addressed.

BACKGROUND OF THE INVENTION

Light-emitting diodes (LEDs) can be used to provide low-cost, low-power lighting in a variety of situations, using a variety of colors. Furthermore, by employing groups of multiple-color LEDs, it is possible to produce a greater variety of color in a lighting device then would be available with individual LEDs. One way to further increase the variety of color available in a lighting device would be to vary the intensity of the individual LEDs in a group of multiple-color LEDs.

However, different LEDs can have different sizes and thicknesses, particularly if different brands of LEDs are mixed. But, using such a variety of LEDs requires individual control of all the dies connected to the lighting device. This is in contrast to a conventional approach in which a controller sends a signal to each package where an electronic board will control each pixel (i.e., LED color).

It would therefore be desirable to provide a system and method that allows for the individual control of a cluster of similar-colored LEDs in a multiple-color lighting device containing LEDs that emit light of differing colors.

SUMMARY OF THE INVENTION

A variable-color light-emitting structure is provided, including: a ground path connected to a ground voltage; a first current path configured to receive and pass a first control current; a first light-emitting element connected to the first current path, configured to receive the first control current from the first current path, configured to generate light within a first wavelength range based on the received first control current, and configured to pass the first control current; a first conductive substrate portion formed over the first light-emitting element, and electrically connected to the first light-emitting element, the first conductive substrate being configured to receive and pass the first control current from the first light-emitting element; a first connection element, having a first upper contact and a first lower contact, the first connection element being configured to receive the first control current from the first conductive substrate, and to pass the first control current from the first upper contact to the first lower contact; a second current path configured to receive and pass the first control current from the first connection element; a second light-emitting element being electrically connected to the second current path, being configured to receive the first control current from the second current path, being configured to generate light within the first wavelength range based on the received first control current, and configured to pass the first control current; a second conductive substrate portion formed over the second light-emitting element, and electrically connected to the second light-emitting element, the second conductive substrate being configured to receive and pass the first control current; and a grounding element electrically connected between the second conductive substrate portion and the ground path, the grounding element being configured to receive the first control current from the second substrate portion, and to pass the first control current to the ground path.

The first and second conductive substrate portions may both be substantially transparent the first wavelength range.

A first voltage drop across the first light-emitting element may be sufficient to cause the first light-emitting element to emit light in the first wavelength range, and a second voltage drop across the second light-emitting element is sufficient to cause the second light-emitting element to emit light in the first wavelength range.

The first current path may be electrically connected to a first pad, and may be configured to receive the first control current from the first pad.

The first wavelength range may produce one of red, green, blue and yellow light.

The first and second light-emitting elements may be light-emitting diodes.

The first and second conductive substrate portions may be separated by a non-conductive material.

The variable-color light-emitting structure may further include: a third current path configured to receive and pass the first control current; a third light-emitting element being electrically connected to the third current path, being configured to receive the first control current from the third current path, being configured to generate light within the first wavelength range based on the received first control current; a third conductive substrate portion formed over the third light-emitting element, and electrically connected to the third cathode, the third conductive substrate being configured to receive and pass the first control current from the third cathode; and a third connection element, having a third upper contact and a third lower contact, the third lower contact being electrically connected to the first current path, the third connection element being configured to receive the first control current from the third conductive substrate, and to pass the first control current from the first upper contact to the first current path, through the first lower contact.

The variable-color light-emitting structure may further include: a fourth current path configured to receive and pass a second control current; a fourth light-emitting element having a fourth anode and a fourth cathode, the fourth anode being electrically connected to the fourth current path and configured to receive the second control current from the fourth current path, the fourth light-emitting element being configured to generate light within a second wavelength range, different from the first wavelength range, based on the second control current received at the fourth anode, and to pass the second control current from the fourth anode to the fourth cathode; a fourth conductive substrate portion formed over the fourth light-emitting element, and electrically connected to the fourth cathode, the fourth conductive substrate being configured to receive and pass the second control current from the fourth cathode; a fourth connection element configured to receive and pass the second control current from the fourth conductive substrate; a fifth current path configured to receive and pass the second control current from the fourth connection element; a fifth light-emitting element having a fifth anode and a fifth cathode, the fifth anode being electrically connected to the fifth current path and configured to receive the second control current from the fifth current path, the fifth light-emitting element being configured to generate light within the second wavelength range based on the second control current received at the fifth anode, and to pass the second control current from the fifth anode to the fifth cathode; a fifth conductive substrate portion formed over the fifth light-emitting element, and electrically connected to the fifth cathode, the fifth conductive substrate being configured to receive and pass the second control current from the fifth cathode; and a grounding element electrically connected between the fifth conductive substrate portion and ground, the grounding element being configured to receive the second control current from the fifth substrate portion, and to pass the second control current to ground.

The first, second, fourth, and fifth light-emitting elements may be light-emitting diodes.

The second wavelength range may produce one of red, green, blue and yellow light.

The variable-color light-emitting structure may further include: a sixth current path configured to receive and pass the second control current; a sixth light-emitting element having a sixth anode and a sixth cathode, the sixth anode being electrically connected to the sixth current path and configured to receive the second control current from the sixth current path, the sixth light-emitting element being configured to generate light within the second wavelength range based on the second control current received at the sixth anode, and to pass the second control current from the sixth anode to the sixth cathode; a sixth conductive substrate portion formed over the sixth light-emitting element, and electrically connected to the sixth cathode, the sixth conductive substrate being configured to receive and pass the second control current from the sixth cathode; and a sixth connection element configured to receive and pass the second control current from the sixth conductive substrate to the fourth current path.

A method is provided of forming a variable-color light-emitting structure, including: placing a ground path over a substrate, such that the ground path is electrically connected to a ground voltage; placing a first current path over the substrate; placing a second current path over the substrate; placing a first light-emitting element over the first current path such that the light-emitting element is electrically connected to the first current path, the first light-emitting element is configured to generate light within a first wavelength range based on a first control current, and to pass the first control current; placing a second light-emitting element over the second current path, such that the second light-emitting element is electrically connected to the second current path, the second light-emitting element being configured to generate light within the first wavelength range based on the first control current, and to pass the first control current; placing a grounding element having a first upper contact electrically connected to a lower contact over the ground path, such that the lower contact is electrically connected to the ground path; placing a first connection element, having a first upper contact and a first lower contact, over the second current path, such that the first lower contact is electrically connected to the second current path, the first connection element being configured to pass the first control current from the first upper contact to the first lower contact; placing a first conductive substrate portion over the first light-emitting element and the first connection element, such that the first conductive substrate portion electrically connects the first light-emitting element to the first upper contact; and placing a second conductive substrate portion over the second light-emitting element and the grounding element, such that the second conductive substrate portion electrically connects the second light-emitting element to the first upper contact.

The operations of placing the first conductive substrate portion and placing the second conductive substrate portion may include: placing a base conductive substrate over the first light-emitting element, the first connection element, the second light-emitting element, and the grounding element; and cutting a gap in the base conductive substrate such that a first portion of the base conductive substrate forms the first conductive substrate portion, a second portion of the base conductive substrate forms the second conductive substrate portion, and the first and second conductive substrate portions are electrically isolated from each other.

The first current path may be electrically connected to a first pad, and may be configured to receive the first control current from the first pad.

The first wavelength range may produce one of red, green, blue and yellow light.

The first and second light-emitting elements may be light-emitting diodes.

The second conductive substrate portion may be placed such that it is separated from the first conductive substrate portion by a non-conductive material.

The method may further include: placing a third current path over the substrate;

placing a third light-emitting element over the third current path, such that the third light-emitting element is electrically connected to the third current path, the third light-emitting element being configured to generate light within the first wavelength range based on the first control current, and to pass the first control current; placing a third connection element, having a third upper contact and a third lower contact, over the first current path, such that the third lower contact is electrically connected to the first current path, the third connection element being configured to pass the first control current from the third upper contact to the third lower contact; and placing a third conductive substrate portion over the third light-emitting element and the third connection element, such that the third conductive substrate portion electrically connects the third light-emitting element to the third upper contact, wherein the third current path is electrically connected to the first light-emitting element.

The method may further include: placing a fourth current path over the substrate; placing a fifth current path over the substrate; placing a fourth light-emitting element over the fourth current path, such that the fourth light-emitting element is electrically connected to the fourth current path, the fourth light-emitting element is configured to generate light within a second wavelength range based on a second control current received at the fourth anode, and to pass the second control current from the fourth anode to the fourth cathode; placing a fifth light-emitting element, having a fifth anode and a fifth cathode, over the fifth current path, such that the fifth anode is electrically connected to the fifth current path, the fifth light-emitting element being configured to generate light within the second wavelength range based on the second control current received at the fifth anode, and to pass the second control current from the fifth anode to the fifth cathode; placing a fourth connection element, having a fourth upper contact and a fourth lower contact, over the fifth current path, such that the fourth lower contact is electrically connected to the fifth current path, the fourth connection element being configured to pass the second control current from the fourth upper contact to the fourth lower contact; placing a fourth conductive substrate portion over the fourth light-emitting element and the fourth connection element, such that the fourth conductive substrate portion electrically connects the fourth cathode to the fourth upper contact; and placing a fifth conductive substrate portion over the fifth light-emitting element and the grounding element, such that the fifth conductive substrate portion electrically connects the fifth cathode to a second upper contact of the grounding element, the second upper contact being electrically connected to the lower contact.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

FIG. 14 is a circuit diagram of an equivalent circuit of the lighting device portion of FIG. 7 according to disclosed embodiments;

FIG. 16 is a flow chart describing the operation of placing the first and second transparent conductive substrate portions of the method of FIG. 15 according to first disclosed embodiment; and FIG. 17 is a flow chart describing the operation of placing the first and second transparent conductive substrate portions of the method of FIG. 15 according to second disclosed embodiments.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Furthermore, elements having the same number represent the same element across the various figures, and throughout the disclosure. Their description is not always repeated for each embodiment, but may be inferred from previous descriptions. Elements that have the same number but have the addition of a letter designator indicate distinct embodiments of a more generic element.

Light-Emitting Element

Figure 1:
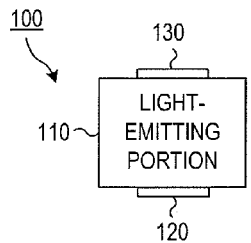
FIG. 1 is a diagram of a light-emitting element according to disclosed embodiments.

FIG. 1 is a diagram of a light-emitting element 100 according to disclosed embodiments. As shown in FIG. 1, the light-emitting element 100 includes a light-emitting portion 110, a first contact 120, and a second contact 130.

The light-emitting portion 110 operates to generate light of a given wavelength based on an electrical signal received at the first contact 120.

The first contact 120 operates to receive the electrical signal that controls the light-emitting portion 110.

The second contact 130 operates to pass the electrical signal that controls the light-emitting portion 110, either to ground or to another device.

In some embodiments, the light-emitting element 100 can be a light-emitting diode (LED). In such case, the first contact 120 will be an anode, and the second contact 130 will be a cathode.

Multiple-Color Lighting Device (First Embodiment)

Figure 2:
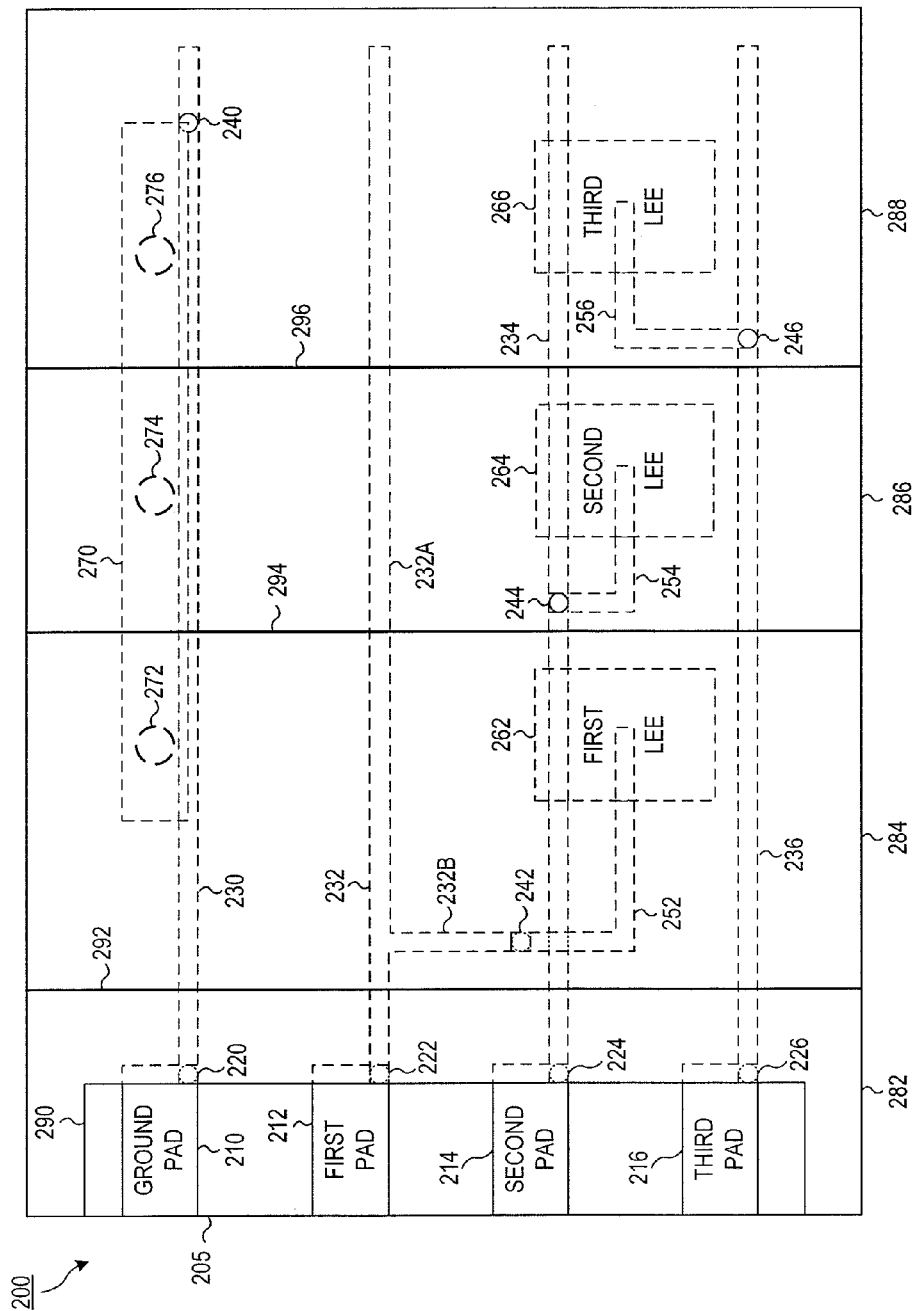
FIG. 2 is an overhead view of a portion of a three-color lighting device according to first disclosed embodiments.

FIG. 2 is an overhead view of a portion of a three-color lighting device 200 according to first disclosed embodiments. As shown in FIG. 2, the lighting device portion 200 includes a bottom substrate 205, a ground pad 210, a first pad 212, a second pad 214, a third pad 216, first through eleventh vias 220, 222, 224, 226, 240, 242, 244, 246, 272, 274, 276, a ground line 230, a first control line 232, a second control line 234, a third control line 236, first through third connection lines 252, 254, 256, a first light-emitting element 262, a second light-emitting element 264, a third light-emitting element 266, a grounding element 270, first through third conductive top substrate portions 282, 284, 286, pad opening 290, and first through third isolation portions 292, 294, 296.

Although not explicitly disclosed in FIG. 2, there is also an affixing layer provided between the bottom substrate 205 and the first through fourth top substrate portions 282, 284, 286, 288, and around all of the other elements located between these two substrates. This affixing layer is configured to fix these other elements in place and to secure the bottom substrate 205 and the first through fourth top substrate portions 282, 284, 286, 288 to each other. Because light from the light-emitting elements 252, 254, 256 will need to pass through the affixing layer, it is generally desirable that the affixing layer also be substantially transparent to the wavelengths of light that are emitted from the light-emitting elements 252, 254, 256.

In the embodiments of FIG. 2, the various elements are located at different heights from the bottom substrate 205. In general, most elements will be located either on one of a bottom layer, a lower trace layer 300, an upper trace layer 400, a device layer 500, and a top layer 600, or between two such layers. (See, FIGS. 3-6, as described below.) The lower trace layer 300 is formed over the bottom layer; the upper trace layer 400 is formed over the lower trace layer 300; the device layer 500 is located over the upper trace layer 400; and the top layer 600 is formed over the device layer 500.

The bottom substrate 205 serves as a base for the remainder of the lighting device 200. As a reference direction, the lower substrate 105 can be considered to be a "bottom" substrate upon which the other elements are stacked. However, this is as a point of reference only. The lighting device 200 has no inherent direction, and can be oriented in any manner, even with the lower substrate 105 being on the "top" of the structure.

The lower substrate 105 can be made of polyethylene terephthalate (PET), polyethylene napthalate (PEN), polyester, a polymer, an oxide-coated polymer, a flexible plastic, a metal-coated flexible plastic, or any suitable flexible material. If the entire lighting device 200 needs to be flexible, then the lower substrate 105 should be flexible. Because light does not typically shine out of the lower substrate 105, it is not typically necessary for the lower substrate 105 to be transparent to light.

The ground pad 210 is formed on the lower substrate 105 and serves as a connector from the lighting device 200 to a ground voltage. As such, it is formed to be open to the outside of the lighting device 200. In various embodiments, the ground pad 210 can be any suitable electrical connector, e.g., a metal pad.

The first pad 212, the second pad 214, and the third pad 216 are formed on the lower substrate 105 and serve as connectors from the lighting device 200 to elements that provide a first control signal, a second control signal, and a third control signal, respectively. The first, second, and third control signals are generated to control the operation of first, second, and third light-emitting elements on the lighting device 200. In various embodiments, the first, second, and third pads 212, 214, 216 can be any suitable electrical connector, e.g., a metal pad.

In this embodiment, the substrate 105, the ground pad 210, and the first, second, and third pads 212, 214, 216 can be considered to be on a bottom layer of the lighting device 200.

The first via 220 is formed through the affixing layer and is filled with a conductive material that electrically connects the ground pad 210 to the ground line 230. The first via 220 can be considered to pass from the bottom layer to the lower trace layer 300.

The second through fourth vias 222, 224, 226 are formed through the affixing layer and are filled with a conductive material that electrically connects the first, second, and third pads 212, 214, 2162 the first control line 232, the second control line 234, and the third control line 236, respectively. The second through fourth vias 222, 224, 226 pass from the bottom layer to the lower trace layer 300.

The ground line 230 is electrically connected to the ground pad 210, and extends parallel to the surface of the lower substrate 205. The ground line 230 serves to electrically connect the fifth via 240 to the ground pad 210. The ground line 230 is located in the lower trace layer 300. It may extend past the portion of the lighting device 200 disclosed in FIG. 2 and connect to other vias as the light-emitting elements 252, 254, 256, the ground pad 270, and related structures, are repeated.

The first control line 232, the second control line 234, and the third control line 236 are electrically connected to the first pad 212, the second pad 214, and the third pad 216, respectively and extend on or near the surface of the lower substrate 205. The first control line 232 serves to connect the second via 222 to the sixth via 242; the second control line 234 serves to electrically connect the third via 224 to the seventh of via 244; and the third control line 236 serves to electrically connect the third via 226 to the eighth via 246. The first, second, and third control lines 232, 234, 236 are all located in the lower trace layer 300. They may extend past the portion of the lighting device 200 disclosed in FIG. 2 and connect to other vias as the light-emitting elements 252, 254, 256, the ground pad 270, and related structures are repeated.

The first control line 232 includes two sections, a main section 232A, and a side section 232B. The main section 232A extends from the first pad 212 along the lighting device 200 in a direction parallel to the line of light-emitting elements 252, 254, 256. The side section 232B extends from the main section 232A in a direction perpendicular to the line of light-emitting elements 252, 254, 256.

In alternate embodiments, the side section 232B can be eliminated. In this case, the size of the first connection element 262 and the location of the sixth via 242 can be adjusted such that the fifth via 242 is located over the main section 232A, and the end of the first connection element 262 is located above the sixth via 242. Likewise, any of the ground line 230, the second control line 234, and the third control line 236 can be formed to have a main section and a side section. This allows the location of the fifth through eighth vias 240, 242, 244, 246 to be varied with respect to the light-emitting elements 252, 254, 256. This flexibility of location can aid in the design of the lighting device 200.

The fifth via 240 is formed through the affixing layer and is filled with a conductive material that electrically connects the ground line 230 to the grounding element 270. The fifth via 240 passes from the lower trace layer 300 to the device layer 500.

The sixth via 242 is formed through the affixing layer and is filled with a conductive material that electrically connects the first control line 232 to the first connection line 262; the seventh via 244 is formed through the affixing layer and is filled with a conductive material that electrically connects the second control line 234 to the second connection line 264; and the eighth via 246 is formed through the affixing layer and is filled with conductive material electrically connects the third control line 236 to the third connection line 266. The sixth through eighth vias 242, 244, 246 pass from the lower trace layer 300 to the upper trace layer 400.

The first through third connection lines 252, 254, 256 serve to electrically connect the sixth through eighth vias 242, 244, 246, respectively, to the bottoms of the first, second, and third light-emitting elements 262, 264, 266, respectively. As noted above, the particular shape of the first through third connection lines 252, 254, 256 can be adjusted based on the location of the sixth through eighth vias 242, 244, 246, such that the end of each respective connection line 252, 254, 256 is located directly above the associated via 242, 244, 246. The first through third connection lines 252, 254, 256 are located in the upper trace layer 400.

The first light-emitting element 262 operates to emit light of a first wavelength in response to a first control signal supplied to the first pad 212. It also serves to pass the first control signal from a bottom contact to a top contact. The first light-emitting element 262 is located in the device layer 500.

The second light-emitting element 264 operates to emit light of a second wavelength, different from the first wavelength, in response to a second control signal supplied to the second pad 214. It also serves to pass the second control signal from a bottom contact to a top contact. The second light-emitting element 264 is located in the device layer 500.

The third light-emitting element 266 operates to emit light of a third wavelength, different from the first and second wavelengths, in response to a third control signal supplied to the third pad 216. It also serves to pass the third control signal from a bottom contact to a top contact. The third light-emitting element 266 is located in the device layer 500.

In various embodiments, the first, second, and third light-emitting elements 262, 264, 266 may be light-emitting diodes (LEDs).

In one set of embodiments, the first, second, and third wavelengths can be "red" (620-750 nm), "green" (495-570 nm), and "blue" (450-495 nm). However, this is merely one example. Alternate embodiments could employ any desired combination of colors, including colors not visible to the naked eye (e.g., infrared light). Furthermore, although the disclosed embodiments show three light-emitting elements 252, 254, 256, this is also by way of example. Alternate embodiments could use two light-emitting elements, or four or more light-emitting elements, as desired. In such cases, connections similar to those shown here for the three light-emitting elements would be made.

The grounding element 270 serves to connect the ninth through eleventh vias 272, 274, 276 to the fifth via 240, and the ground voltage. In some embodiments, the grounding element 270 can be a ground bar. The grounding element 270 is located in the device layer 500.

The ninth through eleventh vias 272, 274, 276 pass through the affixing layer and are filled with conductive material that electrically connects the grounding element 270 to the second through fourth top substrate portions 284, 286, 288, respectively. The ninth through eleventh vias 272, 274, 276 pass from the device layer 500 to the bottom of the top layer 600.

The first through fourth conductive top substrate portions 282, 284, 286, 288 are formed above the affixing layer, and are held in place by the affixing layer. Each of the first through fourth conductive top substrate portions 282, 284, 286, 288 is made of a conductive material that is substantially transparent to the wavelengths of light emitted by the first, second, and third light-emitting elements 262, 264, 266. The first through fourth conductive top substrate portions 282, 284, 286, 288 are formed in the top layer 600. These conductive top substrate portions 282, 284, 286, 288 collectively cover all of the portion of the lighting device shown in FIG. 2, with the exception of the pad opening 290.

The first conductive top substrate portion 282 extends over the ground pad 210, the first pad 212, the second pad 214, and the third pad 216. It contains a cut-out portion called the pad opening 290 that is located above at least part of each of the ground pad 210, the first pad 212, the second pad 214, and the third pad 216.

The second conductive top substrate portion 284 extends over the first light-emitting element 262 and a portion of the ground element 270. It is electrically connected to a top of the first light-emitting element 262, and to a top of the ninth via 272. The second conductive top substrate portion 284 serves to electrically connect the first light-emitting element 262 to the ninth via 272, and through the ninth via 272 to the grounding element 270.

The third conductive top substrate portion 286 extends over the second light-emitting element 264 and a portion of the ground element 270. It is electrically connected to a top of the second light-emitting element 264, and to a top of the tenth via 274. The third conductive top substrate portion 286 serves to electrically connect the second light-emitting element 264 to the tenth via 274, and through the tenth via 274 to the grounding element 270.

The fourth conductive top substrate portion 288 extends over the third light-emitting element 266 and a portion of the ground element 270. It is electrically connected to a top of the third light-emitting element 266, and to a top of the eleventh via 276. The fourth conductive top substrate portion 288 serves to electrically connect the third light-emitting element 266 to the eleventh via 276, and through the eleventh via 276 to the grounding element 270.

The pad opening 290 extends through the first conductive substrate portion 282 and the affixing layer to expose at least part of each of the ground pad 210 and the first, second, and third pads 212, 214, 216. It extends from the top substrate layer 600, through the device layer 500, the upper trace layer 400, and the lower trace layer 300.

The first isolation portion 292 is located between the first top substrate layer 282 and the second top substrate layer 284. It serves to electrically isolate the first top substrate layer 282 from the second top substrate layer 284.

The second isolation portion 294 is located between the second top substrate layer 284 and the third top substrate layer 286. It serves to electrically isolate the second top substrate layer 284 from the third top substrate layer 286.

The third isolation portion 296 is located between the third top substrate layer 286 and the fourth top substrate layer 288. It serves to electrically isolate the third top substrate layer 286 from the fourth top substrate layer 288.

The first through third isolation portions 292, 294, 296 are each filled with an insulating material, which provides the necessary electrical isolation. The first through third isolation portions 292, 294, 296 are located in the top layer 600.

The Lower Trace Layer

Figure 3:
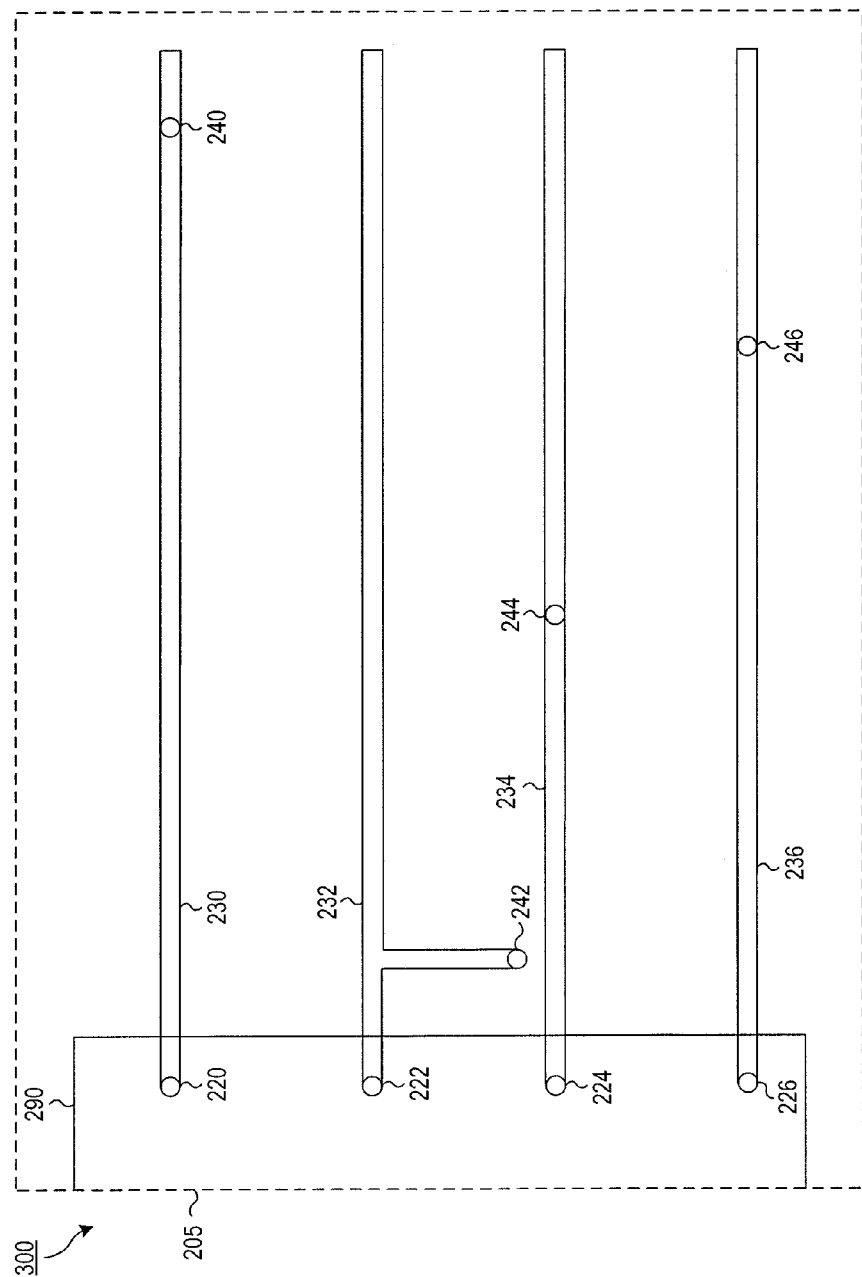
FIG. 3 is an overhead view of the lower trace layer of the lighting device portion of FIG. 2 according to first disclosed embodiments.

FIG. 3 is an overhead view of the lower trace layer 300 of the lighting device portion 200 of FIG. 2 according to first disclosed embodiments. The lower trace layer 300 is located between the bottom layer and the upper trace layer 400. In order to make the orientation of the elements in the lower trace layer 300 clear, the location and size of the bottom substrate 205 of the lighting element portion 200, located below the lower trace layer 300, is shown using dashed lines.

As shown in FIG. 3, lower trace layer 300 includes the ground line 230, the first, second, and third control lines 232, 234, 236, and the pad opening 290. The lower trace layer 300 also connects to the top of the first through fourth vias 220, 222, 224, 226, and the bottom of the fifth through eighth vias 240, 242, 244, 246. The structure of these elements has been discussed above with respect to FIG. 2, and will not be repeated here for the sake of brevity.

The ground line 230 electrically connects the first via 220 to the fifth via 240, and in doing so allows the ground voltage to be carried from the first via 220 to the fifth via 240.

The first control line 232 electrically connects the second via 222 to the sixth via 242, and in doing so allows the first control signal to be carried from the second via 222 to the sixth via 242.

The second control line 234 electrically connects the third via 224 to the seventh via 244, and in doing so allows the second control signal to be carried from the third via 224 to the seventh via 244.

The third control line 236 electrically connects the fourth via 226 to the eighth via 246, and in doing so allows the third control signal to be carried from the fourth via 226 to the eighth via 246.

The pad opening 290 is a gap in the affixing layer throughout the entirety of the lower trace layer 300.

The Upper Trace Layer

Figure 4:
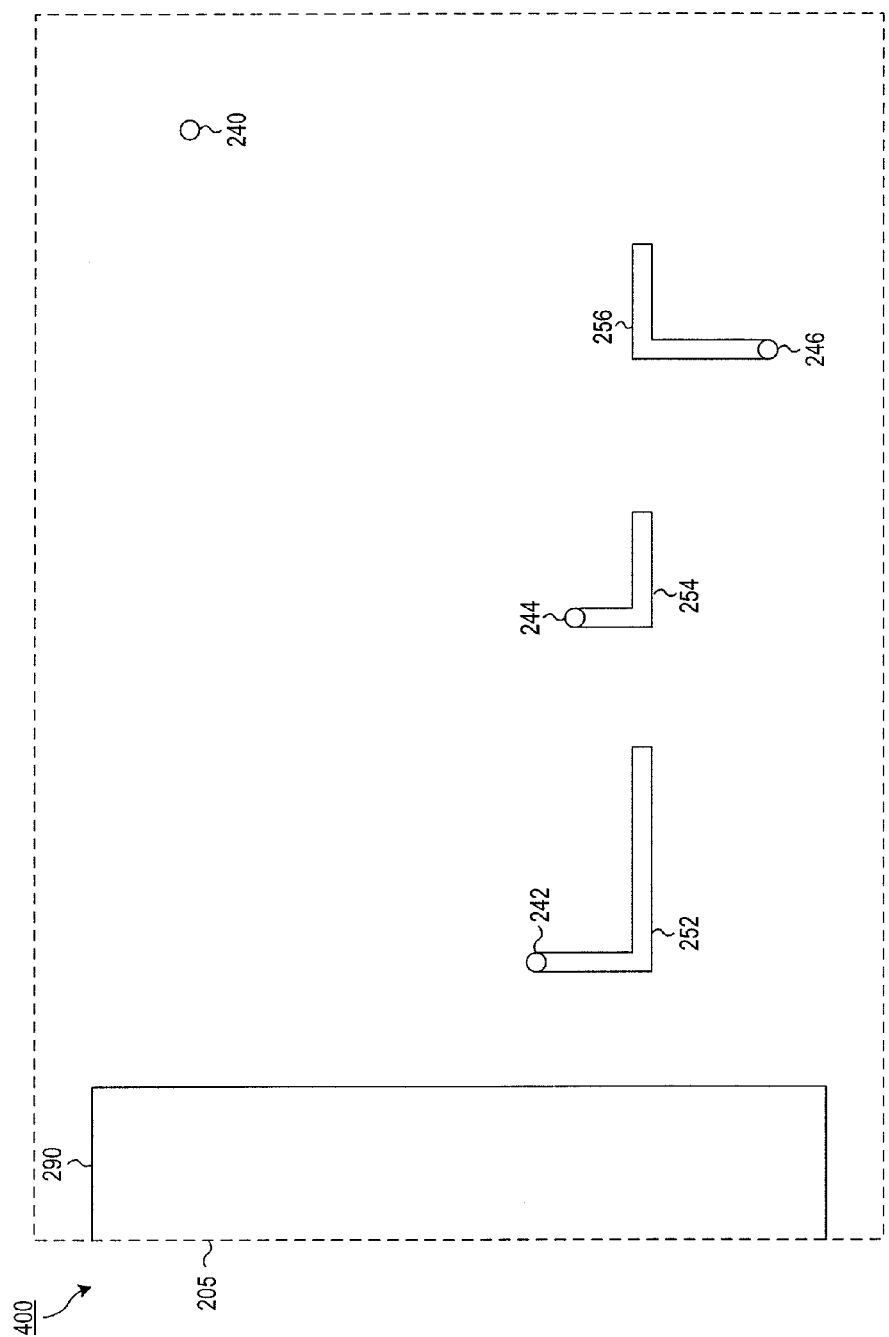
FIG. 4 is an overhead view of the top trace layer of the lighting device portion of FIG. 2 according to first disclosed embodiments.

FIG. 4 is an overhead view of the top trace layer 400 of the lighting device portion 200 of FIG. 2 according to first disclosed embodiments. The top trace layer 400 is located between the lower trace layer 300 and the device layer 500. In order to make the orientation of the elements in the top trace layer 400 clear, the location and size of the bottom substrate 205 of the lighting element portion 200, located below the top trace layer 400, is shown using dashed lines.

As shown in FIG. 4, the top trace layer 400 includes the first through third connection elements 252, 254, 256, the fifth via 240, and the pad opening 290. The top trace layer 400 also connects to the top of the sixth through eighth vias 242, 244, 246, and to the bottom contacts of the first, second, and third light-emitting elements 262, 264, 266. The structure of these elements has been discussed above with respect to FIG. 2, and will not be repeated here for the sake of brevity.

The first connection element 252 electrically connects the sixth via 242 to the bottom contact of the first light-emitting element 262, and in doing so allows the first control signal to be carried from the sixth via 242 to the bottom contact of the first light-emitting element 262.

The second connection element 254 electrically connects the seventh via 244 to the bottom contact of the second light-emitting element 264, and in doing so allows the second control signal to be carried from the seventh via 244 to the bottom contact of the second light-emitting element 264.

The third connection element 256 electrically connects the eighth via 246 to the bottom contact of the room light-emitting element 266, and in doing so allows the third control signal to be carried from the eighth via 246 to the bottom contact of the third light-emitting element 266.

The fifth via 240 passes through the top trace layer 400 on its way from the ground line 230 to the grounding element 270.

The pad opening 290 is a gap in the affixing layer throughout the entirety of the upper trace layer 400.

The Device Layer

Figure 5:
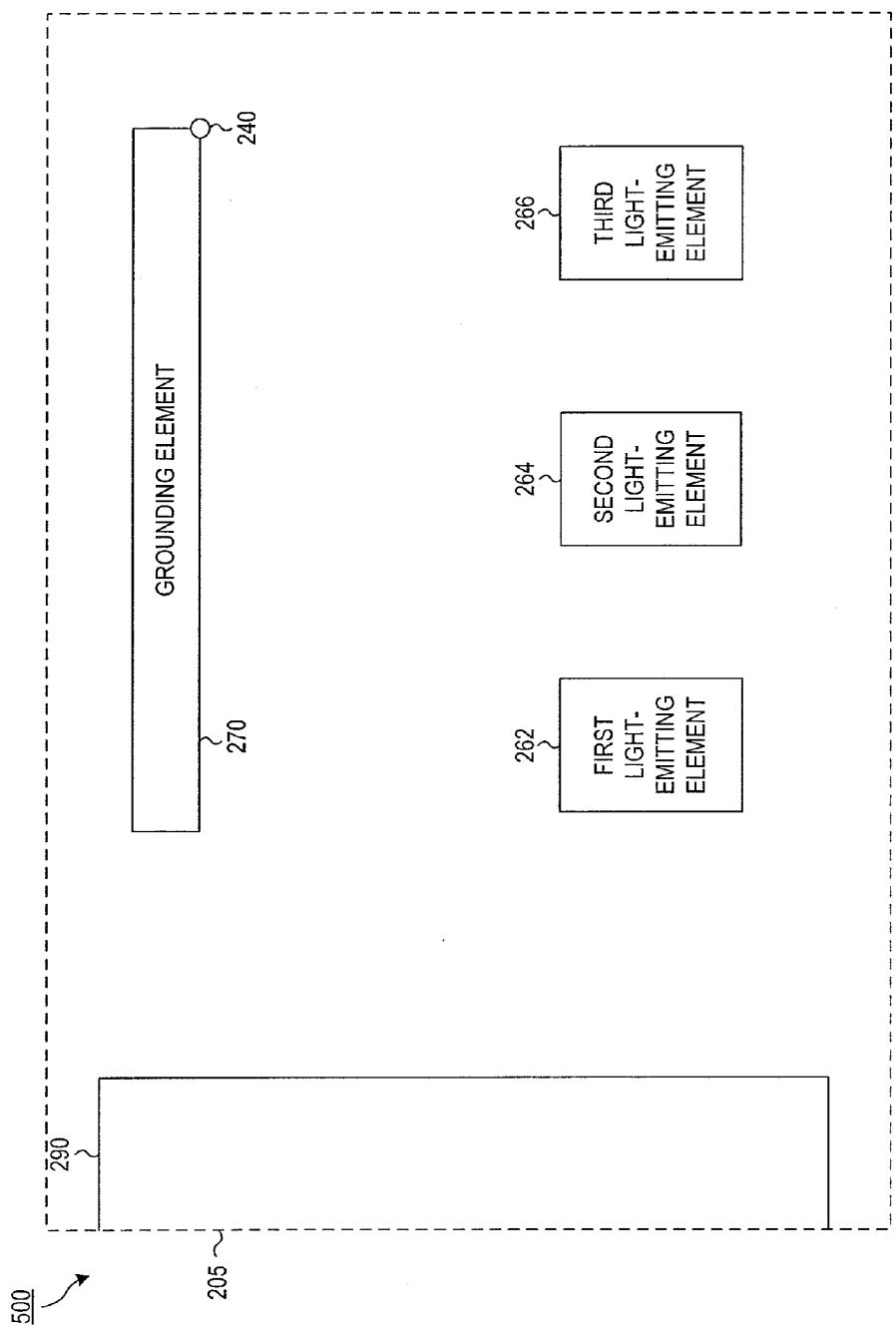
FIG. 5 is an overhead view of a device layer of the lighting device portion of FIG. 2 according to first disclosed embodiments.

FIG. 5 is an overhead view of a device layer 500 of the lighting device portion 200 of FIG. 2 according to first disclosed embodiments. The device layer 500 is located between the top trace layer 400 and the top layer 600. In order to make the orientation of the elements in the device layer 500 clear, the location and size of the bottom substrate 205 of the lighting element portion 200, located below the device layer 500, is shown using dashed lines.

As shown in FIG. 5, the device layer 500 includes the first light-emitting element 262, the second light-emitting element 264, the third light-emitting element 266, the grounding element 270, and the pad opening 290. The device layer 500 also connects to the top of the fifth via 240, and to at least a portion of the first through third connection elements 252, 254, 256. The structure of these elements has been discussed above with respect to FIG. 2, and will not be repeated here for the sake of brevity.

The first light-emitting element 262 electrically connects the first connection element 252 to the second conductive top substrate portion 284, and in doing so allows the first control signal to be carried from the first connection element 252 to the second conductive top substrate portion 284. In addition, the first light-emitting element 262 emits light of a first wavelength in response to the first control signal.

The second light-emitting element 264 electrically connects the second connection element 254 to the third conductive top substrate portion 286, and in doing so allows the second control signal to be carried from the second connection element 254 to the third conductive top substrate portion 286. In addition, the second light-emitting element 264 emits light of a second wavelength, different from the first wavelength, in response to the second control signal.

The third light-emitting element 266 electrically connects the third connection element 256 to the fourth conductive top substrate portion 288, and in doing so allows the third control signal to be carried from the third connection element 256 to the fourth conductive top substrate portion 288. In addition, the third light-emitting element 266 emits light of a third wavelength, different from the first and second wavelengths, in response to the third control signal.

The grounding element 270 electrically connects the fifth via 240 to the ninth through eleventh vias 272, 274, 276, and in doing so allows the ninth through eleventh vias 272, 274, 276 to connect to a ground voltage.

The pad opening 290 is a gap in the affixing layer throughout the entirety of the device layer 500.

The Top Trace Layer

Figure 6:
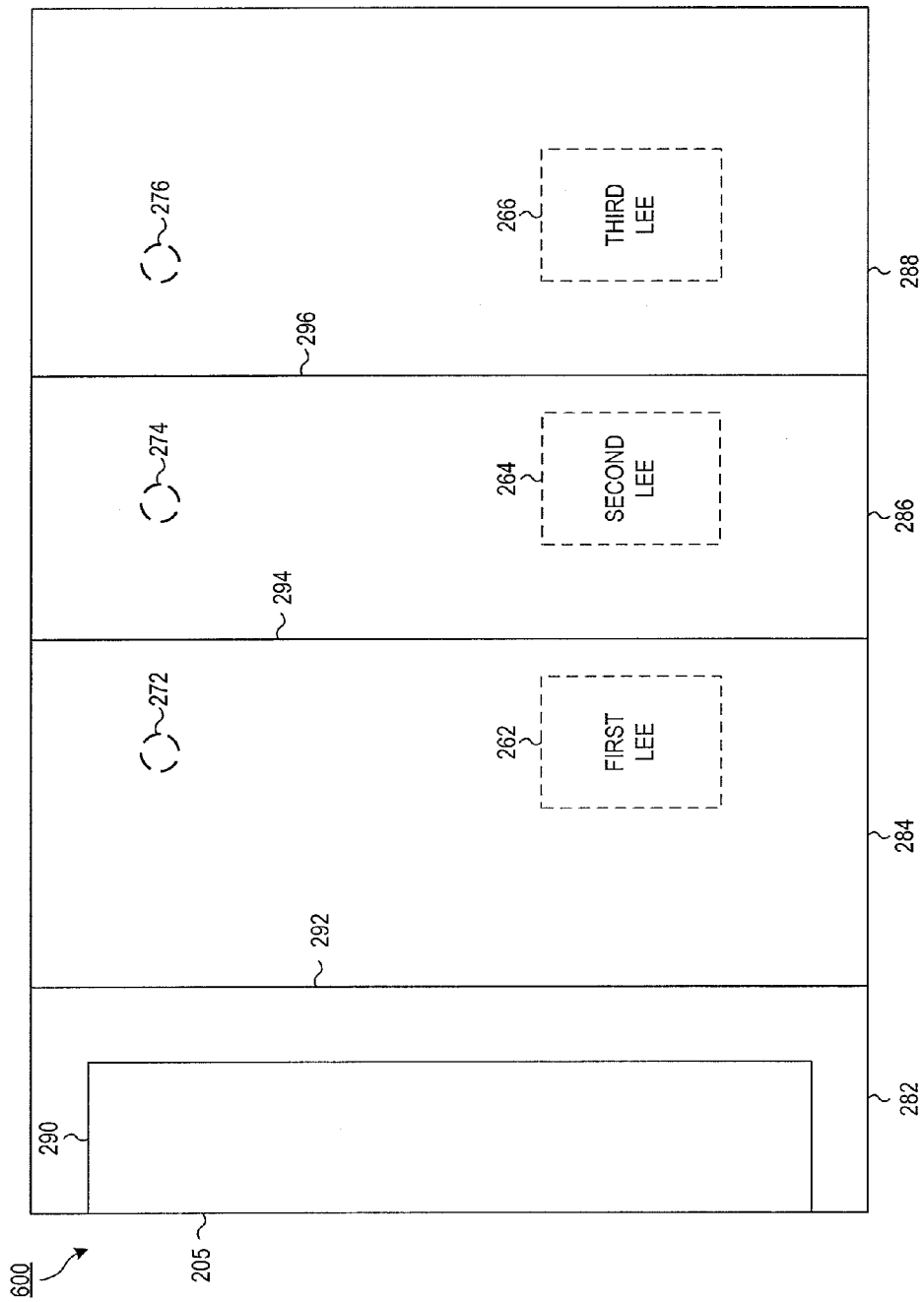
FIG. 6 is an overhead view of a top layer of the lighting device portion of FIG. 2 according to disclosed embodiments.

FIG. 6 is an overhead view of a top layer 600 of the lighting device portion 200 of FIG. 2 according to disclosed embodiments. The top layer 600 is located above the device layer 500.

As shown in FIG. 6, the top layer 600 includes the first through fourth conductive top substrate portions 282, 284, 286, 288, the pad opening 290, and the first through third isolation portions 292, 294, 296. The structure of these elements has been discussed above with respect to FIG. 2, and will not be repeated here for the sake of brevity.

The first conductive top substrate portion 282, is formed over the ground pad 210 and the first, second, and third pads 212, 214, 216. It includes the pad opening 290.

The second conductive top substrate portion 284 electrically connects the first light-emitting element 262 to the ninth via 272, and in doing so allows the first control signal to be carried from the first light-emitting element 262 to the ninth via 272, where it connects to a ground voltage, completing the circuit for the first control signal.

The third conductive top substrate portion 286 electrically connects the second light-emitting element 264 to the tenth via 274, and in doing so allows the second control signal to be carried from the second light-emitting element 264 to the tenth via 274, where it connects to a ground voltage, completing the circuit for the second control signal.

The fourth conductive top substrate portion 288 electrically connects the third light-emitting element 266 to the eleventh via 276, and in doing so allows the third control signal to be carried from the third light-emitting element 266 to the eleventh via 276, where it connects to a ground voltage, completing the circuit for the third control signal.

The pad opening 290 is a gap in the first conductive top substrate portion 282 throughout the entirety of the top layer 600.

The first isolation portion 292 electrically isolates the first top substrate layer 282 from the second conductive top substrate portion 284; the second isolation portion 294 electrically isolates the second conductive top substrate portion 284 from the third conductive top substrate portion 286; and the third isolation portion 296 electrically isolates the third conductive top substrate portion 286 from the fourth conductive top substrate portion 288.

Operation of the Multiple-Color Lighting Device (First Embodiment)

In operation, the portion of the lighting device 200 disclosed in FIGS. 2-6 behaves as follows.

A ground voltage is provided to the ground pad 210, passes from the ground pad 210 through the first via 220 to the ground line 230, passes from the ground line 230 through the fifth via 240 to the grounding element 270, and passes from the ground element 270 through the ninth through eleventh vias 272, 274, 276, to the second through fourth conductive top substrate portions 284, 286, 288, respectively. In this way, a ground voltage is supplied to each of the second through fourth conductive top substrate portions 284, 286, 288.

A first control signal is provided to the first pad 212, passes from the first pad 212 through the second via 222 to the first control line 232, passes from the main portion 232A of the first control line 232 to the side portion 232B of the first control line 232, and through the side portion 232B to the sixth via 242, passes through the sixth via 242 to the first connection element 252, and passes through the first connection element 252 to a bottom contact of the first light-emitting element 262. In this way, the first control signal is passed to the first light-emitting element 262, so that the first light-emitting element 262 may emit light in accordance with the first control signal.

The first light-emitting element 262 passes the first control signal to a top contact, where it passes to the second conductive top substrate portion 284, and then passes through the second conductive top substrate portion 284 to the ninth via 272, where it is grounded. In this way, the path of the first control signal is properly grounded, allowing the first control signal to flow. Furthermore, because the second conductive top substrate portion 284 is isolated from the first and third conductive top substrate portions 282, 286 by the first and second isolation portions 292, 294, respectively, the first control signal can pass without interference from any other signals.

A second control signal is provided to the second pad 214, passes from the second pad 214 through the third via 224 to the second control line 234, passes through the second control line 234 to the seventh via 244, passes through the seventh via 244 to the second connection element 254, and passes through the second connection element 254 to a bottom contact of the second light-emitting element 264. In this way, the second control signal is passed to the second light-emitting element 264, so that the second light-emitting element 264 may emit light in accordance with the second control signal.

The second light-emitting element 264 passes the second control signal to a top contact, where it passes to the third conductive top substrate portion 286, and then passes through the third conductive top substrate portion 286 to the tenth via 274, where it is grounded. In this way, the path of the second control signal is properly grounded, allowing the second control signal to flow. Furthermore, because the third conductive top substrate portion 286 is isolated from the second and fourth conductive top substrate portions 284, 288 by the second and third isolation portions 294, 296, respectively, the second control signal can pass without interference from any other signals.

A third control signal is provided to the third pad 216, passes from the third pad 216 through the fourth via 226 to the third control line 236, passes through the third control line 236 to the eighth via 246, passes through the eighth via 246 to the third connection element 256, and passes through the third connection element 256 to a bottom contact of the third light-emitting element 66. In this way, the third control signal is passed to the third light-emitting element 266, so that the third light-emitting element 266 may emit light in accordance with the third control signal.

The third light-emitting element 264 passes the third control signal to a top contact, where it passes to the fourth conductive top substrate portion 288, and then passes through the fourth conductive top substrate portion 288 to the eleventh via 276, where it is grounded. In this way, the path of the third control signal is properly grounded, allowing the third control signal to flow. Furthermore, because the fourth conductive top substrate portion 288 is isolated from the third conductive top substrate portion 286 by the third isolation portion 296, the third control signal can pass without interference from any other signals.

Thus, the portion of a multiple-color lighting device 200 shown in FIG. 2, can individually control the operation of the first, second, and third light-emitting elements 262, 264, 266 by providing respective first, second, and third signals to the first, second, and third pads 212, 214, 216, respectively, and a ground voltage to the ground pad 210.

Multiple-Color Lighting Device (Second Embodiment)

Figure 7:
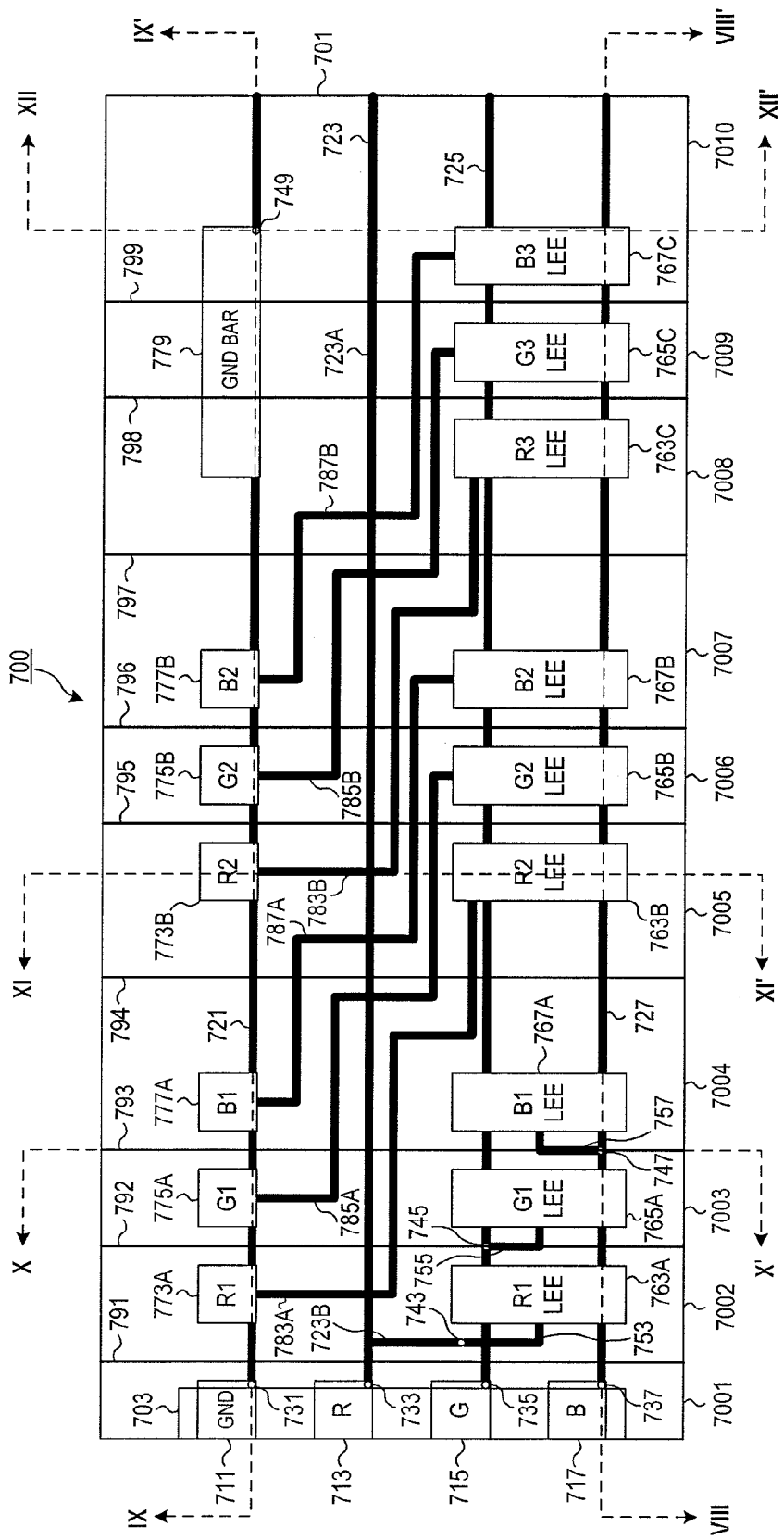
FIG. 7 is an overhead view of a portion of a three-color lighting device according to second disclosed embodiments.

FIG. 7 is an overhead view of a portion of a three-color lighting device 700 according to second disclosed embodiments. The embodiment of FIG. 7 is similar to the embodiments shown in FIG. 2. However, in the embodiments of FIG. 7, the grouping of different-color light-emitting elements is repeated such that there are three groups of three colors of light-emitting elements. This is by way of example only, and alternate embodiments could employ two groups of light-emitting elements, or four or more groups of light emitting elements. Furthermore, the groups could include two different-color light-emitting elements, or four or more different-color light-emitting elements. In addition, although the embodiments of FIG. 7 list the three different colors as red, green, and blue, this is also by way of example. Alternate embodiments could use any desired combination of colors, including those not visible to the naked eye (e.g., infrared light). Alternate embodiments could even employ groups of light-emitting elements that emit light of the same color, but needed to be controlled separately.

As shown in FIG. 7, the lighting device portion 700 includes a bottom substrate 701, an affixing layer 703, a ground pad 711, a red pad 713, a green pad 715, a blue pad 717 a ground line 721, a red control line 723, a green control line 725, a blue control line 727, first through eighth vias 731, 733, 735, 737, 743, 745, 747, 749, first through ninth connection lines 753, 755, 757, 783A, 785A, 787A, 783B, 785B, and 787B, a first red light-emitting element 763A, a first green light-emitting element 765A, a first blue light-emitting element 767A, a second red light-emitting element 763B, a second green light-emitting element 765B, a second blue light-emitting element 767B, a third red light-emitting element 763C, a third green light-emitting element 765C, a third blue light-emitting element 767C, a first red connection circuit 773A, a first green connection circuit 775A, a first blue connection circuit 777A, a second red connection circuit 773B, a second green connection circuit 775B, a second blue connection circuit 777B, a ground bar 779, first through ninth isolation portions 791-799, and first through tenth conductive top substrate portions 7001-7010.

The bottom substrate 701 serves as a base for the remainder of the lighting device 700. As a reference direction, the bottom substrate 701 can be considered to be a "bottom" substrate upon which the other elements are stacked. However, this is as a point of reference only. The lighting device 700 has no inherent direction, and can be oriented in any manner, even with the bottom substrate 701 being on the "top" of the structure.

The bottom substrate 701 can be made of polyethylene terephthalate (PET), polyethylene napthalate (PEN), polyester, a polymer, an oxide-coated polymer, a flexible plastic, a metal-coated flexible plastic, or any suitable flexible material. If the entire lighting device 200 needs to be flexible, then the bottom substrate 701 should be flexible. Because light does not typically shine out of the bottom substrate 701, it is not typically necessary for the bottom substrate 701 to be transparent to light.

The affixing layer 703 is provided between the bottom substrate 701 and the first through tenth conductive top substrate portions 7001-7010, and around all of the other elements located between these two substrates. The affixing layer 703 is configured to fix these other elements in place and to secure the bottom substrate 701 and the first through tenth conductive top substrate portions 7001-7010 to each other. Because light from the light-emitting elements 763A, 765A, 767A, 763B, 765B, 767B, 763C, 765C, 767C will need to pass through the affixing layer 703, it is generally desirable that the affixing layer 703 also be substantially transparent to the wavelengths of light that are emitted from the light-emitting elements 763A, 765A, 767A, 763B, 765B, 767B, 763C, 765C, 767C.

The ground pad 711 is formed on the bottom substrate 701 and serves as a connector from the lighting device 700 to a ground voltage. As such, it is formed to be open to the outside of the lighting device 700. In various embodiments, the ground pad 711 can be any suitable electrical connector, e.g., a metal pad.

The red pad 713, the green pad 715, and the blue pad 717 are formed on the bottom substrate 701 and serve as connectors from the lighting device 700 to elements that provide a red control signal, a green control signal, and a blue control signal, respectively. The red control signal is generated to control the operation of first, second, and third red light-emitting elements 763A, 763B, 763C; the green control signal is generated to control the operation of first, second, and third green light-emitting elements 765A, 765B, 765C; and the blue control signal is generated to control the operation of first, second, and third blue light-emitting elements 767A, 767B, 767C. In various embodiments, the red, green, and blue pads 713, 715, 717 can be any suitable electrical connector, e.g., a metal pad.

The first via 731 is formed through the affixing layer 703, and is filled with a conductive material that electrically connects the ground pad 711 to the ground line 721.

The second via 733 is formed through the affixing layer 703, and is filled with a conductive material that electrically connects the red pad 713 to the red control line 723; the third via 735 is formed through the affixing layer 703, and is filled with a conductive material that electrically connects the green pad 715 to the green control line 725; and the fourth via 737 is formed through the affixing layer 703, and is filled with a conductive material that electrically connects the blue pad 717 to the blue control line 727.

The ground line 721 is electrically connected between the first via 731 and the eighth via 749. It extends parallel to the surface of the bottom substrate 701, and provides a ground voltage to the ground bar 779 through the eighth via 749. The ground line 721 may extend past the portion of the lighting device 700 disclosed in FIG. 7 and connect to other vias as additional groups of light-emitting elements, ground pads, and related structures, are repeated.

The ground bar 779 is electrically connected to the eighth via 749, and is configured to provide a ground voltage to the eighth through tenth conductive top substrate portions 7008-7010

The red control line 723, the green control line 725, and the blue control line 727 are electrically connected to the red pad 711, the green pad 713, and the blue pad 715, respectively and extend on or near the surface of the bottom substrate 701. The red control line 723 serves to connect the second via 733 to the fifth via 743; the green control line 723 serves to connect the third via 735 to the sixth via 745; and the blue control line 725 serves to connect the fourth via 727 to the seventh via 747. The red, green, and blue control lines 723, 725, 727 may extend past the portion of the lighting device 700 disclosed in FIG. 7 and connect to other vias as the light-emitting elements, the ground bar, and related structures are repeated.

The red control line 723 includes two sections, a main section 723A, and a side section 723B. The main section 723A extends from the second via 733 above the red pad 713, along the lighting device 700 in a direction parallel to the line of light-emitting elements 763A, 765A, 767A, 763B, 765B, 767B, 763C, 765C, 767C. The side section 723B extends from the main section 723A in a direction perpendicular to the line of light-emitting elements 763A, 765A, 767A, 763B, 765B, 767B, 763C, 765C, 767C.

In alternate embodiments, the side section 723B can be eliminated. In this case, the size of the first connection element 753 and the location of the fifth via 743 can be adjusted such that the fifth via 743 is located over the main section 723A, and the end of the first connection element 753 is located above the fifth via 743. Likewise, any of the ground line 721, the green control line 725, and the blue control line 727 can be formed to have a main section and a side section. This allows the location of the fifth through eighth vias 743, 745, 747, 749 to be varied in a direction perpendicular to the line of light-emitting elements 763A, 765A, 767A, 763B, 765B, 767B, 763C, 765C, 767C. This flexibility of location can aid in the design of the lighting device 700.

The fifth via 743 is formed through the affixing layer 703, and is filled with a conductive material that electrically connects the red control line 723 to the first connection line 753; the sixth via 745 is formed through the affixing layer 703, and is filled with a conductive material that electrically connects the green control line 725 to the second connection line 755; and the seventh via is formed through the affixing layer 703 and is filled with a conductive material that electrically connects the blue control line 727 to the third connection line 757.

The eighth via 749 is formed through the affixing layer 703, and is filled with a conductive material that electrically connects the ground line 721 to the ground bar 779.

The first connection line 753 serves to electrically connect the fifth via 743 to the bottom of the first red light-emitting element 863A; the second connection line 755 serves to electrically connect the sixth via 745 to the bottom of the first green light-emitting element 865A; and the third connection line 757 serves to electrically connect the seventh via 747 to the bottom of the first blue light-emitting element 767A.

As noted above, the particular shape of the first through third connection lines 753, 755, 757 can be adjusted based on the location of the fifth through seventh vias 743, 745, 747, such that the end of each respective connection line 753, 755, 757 is located directly above the associated via 743, 745, 747.

The first red light-emitting element 763A operates to emit light of a "red" wavelength (i.e., 620-750 nm) in response to the red control signal supplied to the red pad 713, which the first red light-emitting element 763A receives from the first connection line 753. It also serves to pass the red control signal from a bottom contact to a top contact.

The first green light-emitting element 765A operates to emit light of a "green" wavelength (i.e., 495-570 nm), in response to the green control signal supplied to the green pad 715, which the first green light-emitting element 765A receives from the second connection line 755. It also serves to pass the green control signal from a bottom contact to a top contact.

The first blue light-emitting element 765A operates to emit light of a "blue" wavelength (i.e., 450-495 nm), in response to the blue control signal supplied to the blue pad 717, which the first blue light-emitting element 767A receives from the third connection line 757. It also serves to pass the blue control signal from a bottom contact to a top contact.

The first conductive top substrate portion 7001 operates to cover a portion of the bottom substrate 701 that holds the ground pad 711, and the red, green, and blue pads 713, 715, 717. It has a pad opening that passes through the entire first conductive top substrate portion 7001 and the affixing layer 703 below it, and which exposes the gound pad 711, and the red, green, and blue pads 713, 715, 717.

The second conductive top substrate portion 7002 is electrically connected between the first red light-emitting element 763A and the first red connection circuit 773A. In particular, it is connected between a top contact of the first red light-emitting element 763A and a top portion of the first red connection circuit 773A. The second conductive top substrate portion 7002 operates to pass the red control signal from the first red light-emitting element 763A to the first red connection circuit 773A.

The third conductive top substrate portion 7003 is electrically connected between the first green light-emitting element 765A and the first green connection circuit 775A. In particular, it is connected between a top contact of the first green light-emitting element 765A and a top portion of the first green connection circuit 775A. The third conductive top substrate portion 7003 operates to pass the green control signal from the first green light-emitting element 765A to the first green connection circuit 775A.

The fourth conductive top substrate portion 7004 is electrically connected between the first blue light-emitting element 867A and the first blue connection circuit 777A. In particular, it is connected between a top contact of the first blue light-emitting element 767A and a top portion of the first blue connection circuit 777A. The fourth conductive top substrate portion 7004 operates to pass the blue control signal from the first blue light-emitting element 767A to the first blue connection circuit 777A.

The first red connection circuit 773A is electrically connected between the second conductive top substrate portion 7002 and the fourth connection line 783A. It receives the red control signal from the second conductive top substrate portion 7002 at a top portion, passes the red control signal, and provides the red control signal to the fourth connection line 783A at a bottom portion.

The first green connection circuit 775A is electrically connected between the third conductive top substrate portion 7003 and the fifth connection line 785A. It receives the green control signal from the third conductive top substrate portion 7003 at a top portion, passes the green control signal, and provides the green control signal to the fifth connection line 785A at a bottom portion.

The first blue connection circuit 777A is electrically connected between the fourth conductive top substrate portion 7004 and the sixth connection line 787A. It receives the blue control signal from the fourth conductive top substrate portion 7004 at a top portion, passes the blue control signal, and provides the blue control signal to the sixth connection line 787A at a bottom portion.

The fourth connection line 783A is electrically connected between the first red connection circuit 773A and the second red light-emitting element 763B. It is configured to pass the red control signal from the first red connection circuit 773A to the second red light-emitting element 763B.

The fifth connection line 785A is electrically connected between the first green connection circuit 775A and the second green light-emitting element 765B. It is configured to pass the green control signal from the first green connection circuit 775A to the second green light-emitting element 765B.

The sixth connection line 787A is electrically connected between the first blue connection circuit 777A and the second blue light-emitting element 767B. It is configured to pass the blue control signal from the first blue connection circuit 777A to the second blue light-emitting element 767B.

The second red light-emitting element 763B operates to emit light of a "red" wavelength (i.e., 620-750 nm) in response to the red control signal supplied to the red pad 713, which the second red light-emitting element 763B receives from the fourth connection line 783A. It also serves to pass the red control signal from a bottom contact to a top contact.

The second green light-emitting element 765B operates to emit light of a "green" wavelength (i.e., 495-570 nm), in response to the green control signal supplied to the green pad 715, which the second green light-emitting element receives from the fifth connection line 785A. It also serves to pass the green control signal from a bottom contact to a top contact.

The second blue light-emitting element 765B operates to emit light of a "blue" wavelength (i.e., 450-495 nm), in response to the blue control signal supplied to the blue pad 717, which the second blue light-emitting element 765B receives from the sixth connection line 787A. It also serves to pass the blue control signal from a bottom contact to a top contact.

The fifth conductive top substrate portion 7005 is electrically connected between the second red light-emitting element 763B and the second red connection circuit 773B. In particular, it is connected between a top contact of the second red light-emitting element 763B and a top portion of the second red connection circuit 773B. The fifth conductive top substrate portion 7005 operates to pass the red control signal from the second red light-emitting element 763B to the second red connection circuit 773B.

The sixth conductive top substrate portion 7006 is electrically connected between the second green light-emitting element 765B and the second green connection circuit 775B. In particular, it is connected between a top contact of the second green light-emitting element 765B and a top portion of the second green connection circuit 775B. The sixth conductive top substrate portion 7006 operates to pass the green control signal from the second green light-emitting element 765B to the second green connection circuit 775B.

The seventh conductive top substrate portion 7007 is electrically connected between the second blue light-emitting element 767B and the second blue connection circuit 777B. In particular, it is connected between a top contact of the second blue light-emitting element 767B and a top portion of the second blue connection circuit 777B. The seventh conductive top substrate portion 7007 operates to pass the blue control signal from the second blue light-emitting element 767B to the second blue connection circuit 777B.

The second red connection circuit 773B is electrically connected between the fifth conductive top substrate portion 7005 and the seventh connection line 783B. It receives the red control signal from the fifth conductive top substrate portion 7005 at a top portion, passes the red control signal, and provides the red control signal to the seventh connection line 783B at a bottom portion.

The second green connection circuit 775B is electrically connected between the sixth conductive top substrate portion 7006 and the eighth connection line 785B. It receives the green control signal from the sixth conductive top substrate portion 7006 at a top portion, passes the green control signal, and provides the green control signal to the eighth connection line 785B at a bottom portion.

The second blue connection circuit 777B is electrically connected between the seventh conductive top substrate portion 7007 and the ninth connection line 787B. It receives the blue control signal from the seventh conductive top substrate portion 7007 at a top portion, passes the blue control signal, and provides the blue control signal to the ninth connection line 787B at a bottom portion.

The seventh connection line 783B is electrically connected between the second red connection circuit 773B and the third red light-emitting element 763C. It is configured to pass the red control signal from the second red connection circuit 773B to the third red light-emitting element 763C.

The eighth connection line 785B is electrically connected between the second green connection circuit 775B and the third green light-emitting element 765C. It is configured to pass the green control signal from the second green connection circuit 775B to the third green light-emitting element 765C.

The ninth connection line 787B is electrically connected between the second blue connection circuit 777B and the third blue light-emitting element 767C. It is configured to pass the blue control signal from the second blue connection circuit 777B to the third blue light-emitting element 767C.

The third red light-emitting element 763C operates to emit light of a "red" wavelength (i.e., 620-750 nm) in response to the red control signal supplied to the red pad 713, which the third red light-emitting element 763C receives from the seventh connection line 783B. It also serves to pass the red control signal from a bottom contact to a top contact.

The third green light-emitting element 765C operates to emit light of a "green" wavelength (i.e., 495-570 nm), in response to the green control signal supplied to the green pad 715, which the third green light-emitting element 765C receives from the eighth connection line 785B. It also serves to pass the green control signal from a bottom contact to a top contact.

The third blue light-emitting element 765C operates to emit light of a "blue" wavelength (i.e., 450-495 nm), in response to the blue control signal supplied to the blue pad 717, which the third blue light-emitting element 765C receives from the ninth connection line 787B. It also serves to pass the blue control signal from a bottom contact to a top contact.

The eighth conductive top substrate portion 7008 is electrically connected between the third red light-emitting element 763C and ground bar 779. In particular, it is connected between a top contact of the third red light-emitting element 763C and the top of the ground bar 779. The eighth conductive top substrate portion 7008 operates to pass the red control signal from the second red light-emitting element 763B to the second red connection circuit 773B.

The eighth conductive top substrate portion 7008 extends over the third red light-emitting element 763C and a portion of the ground pad 779. It is electrically connected to a top contact of the third red light-emitting element 763C, and to a portion of the top of the ground pad 779. The eighth conductive top substrate portion 7008 serves to electrically connect the third red light-emitting element 763C to the ground pad 779. It is configured to pass the red control signal from the third red light-emitting element 763C to the ground pad 779, where the red control signal is grounded. This allows the red control signal to flow through the remainder of the lighting device portion 700.

The ninth conductive top substrate portion 7009 extends over the third green light-emitting element 765C and a portion of the ground pad 779. It is electrically connected to a top contact of the third green light-emitting element 765C, and to a portion of the top of the ground pad 779. The ninth conductive top substrate portion 7009 serves to electrically connect the third green light-emitting element 765C to the ground pad 779. It is configured to pass the green control signal from the third green light-emitting element 765C to the ground pad 779, where the green control signal is grounded. This allows the green control signal to flow through the remainder of the lighting device portion 700.

The tenth conductive top substrate portion 7010 extends over the third blue light-emitting element 767C and a portion of the ground pad 779. It is electrically connected to a top contact of the third blue light-emitting element 767C, and to a portion of the top of the ground pad 779. The tenth conductive top substrate portion 7010 serves to electrically connect the third blue light-emitting element 767C to the ground pad 779. It is configured to pass the blue control signal from the third blue light-emitting element 767C to the ground pad 779, where the blue control signal is grounded. This allows the blue control signal to flow through the remainder of the lighting device portion 700.

The first isolation portion 791 is located between the first top substrate portion 7001 and the second top substrate portion 7002. It is configured to electrically isolate the first top substrate portion 7001 from the second top substrate portion 7002. Likewise, the second through ninth isolation portions 792-799 are each located between subsequent adjacent pairs of first top substrate portions 7002-7010. Each of the second through ninth isolation portions 792-799 are configured to electrically isolate the pair of adjacent top substrate portions from each other.

In various embodiments, the light-emitting elements 763A, 765A, 767A, 763B, 765B, 767B, 763C, 765C, 767C may be light-emitting diodes (LEDs).

Figure 8:
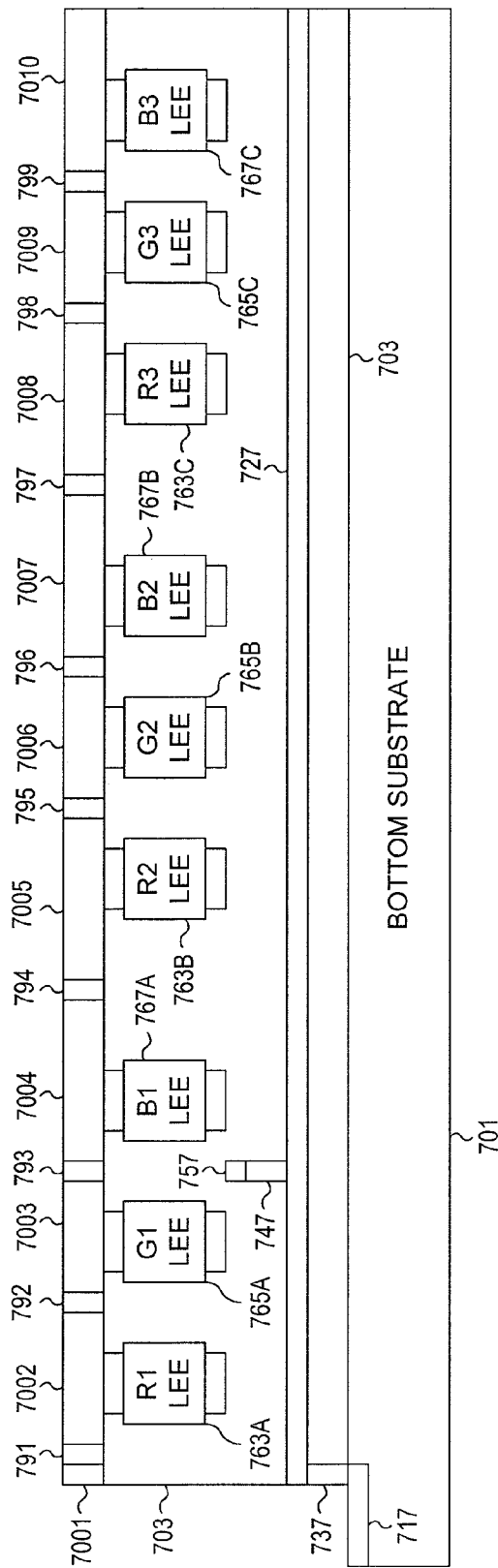
FIG. 8 is a cross-sectional view of the lighting device portion of FIG. 7 along line VII-VII' according to disclosed embodiments.

FIG. 8 is a cross-sectional view of the lighting device portion 700 of FIG. 7 along line VII-VII' according to disclosed embodiments. A basic description of the elements in this drawing has been made above with respect to FIG. 7. That description will not be repeated with respect to FIG. 8.

As shown in FIG. 8, each of the light-emitting elements 763A, 765A, 767A, 763B, 765B, 767B, 763C, 765C, 767C includes a lower contact and an upper contact (unnumbered). The upper contact of the first red light-emitting element 763A is connected to the second conductive top substrate portion 7002; the upper contact of the first green light-emitting element 765A is connected to the third conductive top substrate portion 7003; the upper contact of the first blue light-emitting element 767A is connected to the fourth conductive top substrate portion 7004; the upper contact of the second red light-emitting element 763B is connected to the fifth conductive top substrate portion 7005; the upper contact of the second green light-emitting element 765B is connected to the sixth conductive top substrate portion 7006; the upper contact of the second blue light-emitting element 767B is connected to the seventh conductive top substrate portion 7007; the upper contact of the third red light-emitting element 763C is connected to the eighth conductive top substrate portion 7008; the upper contact of the third green light-emitting element 765C is connected to the ninth conductive top substrate portion 7009; and the upper contact of the third blue light-emitting element 767C is connected to the tenth conductive top substrate portion 7010.

FIG. 8 does not show any connection to the bottom contacts of the light-emitting elements 763A, 765A, 767A, 763B, 765B, 767B, 763C, 765C, 767C, since no connections occur along the line VIII-VIII'.

The first through ninth isolation portions 791-799 each are configured to electrically isolate adjacent conductive top substrate portions from the first through tenth conductive top substrate portions 7001-7010. In one set of embodiments, the isolation portions 791-799 can be filled with an insulating protective covering material applied over the whole device (not shown), although any suitable insulating material can be used.

FIG. 8 also shows the blue control line 727 extending from the blue pad 717, parallel to the surface of the bottom substrate 701. The fourth via 737 extends upward through the affixing layer 703 from the blue pad 717 to the blue control line 727. Likewise, the seventh via 747 extends upward through the affixing layer 703 from the blue control line 727 to the third connection line 757.

In addition, FIG. 8 shows that the first conductive top substrate portion 7001 and the affixing layer 703 have a pad opening (unnumbered) that extends through the first conductive top substrate portion 7001 and the affixing layer 703, to expose the blue pad 717.

Figure 9:
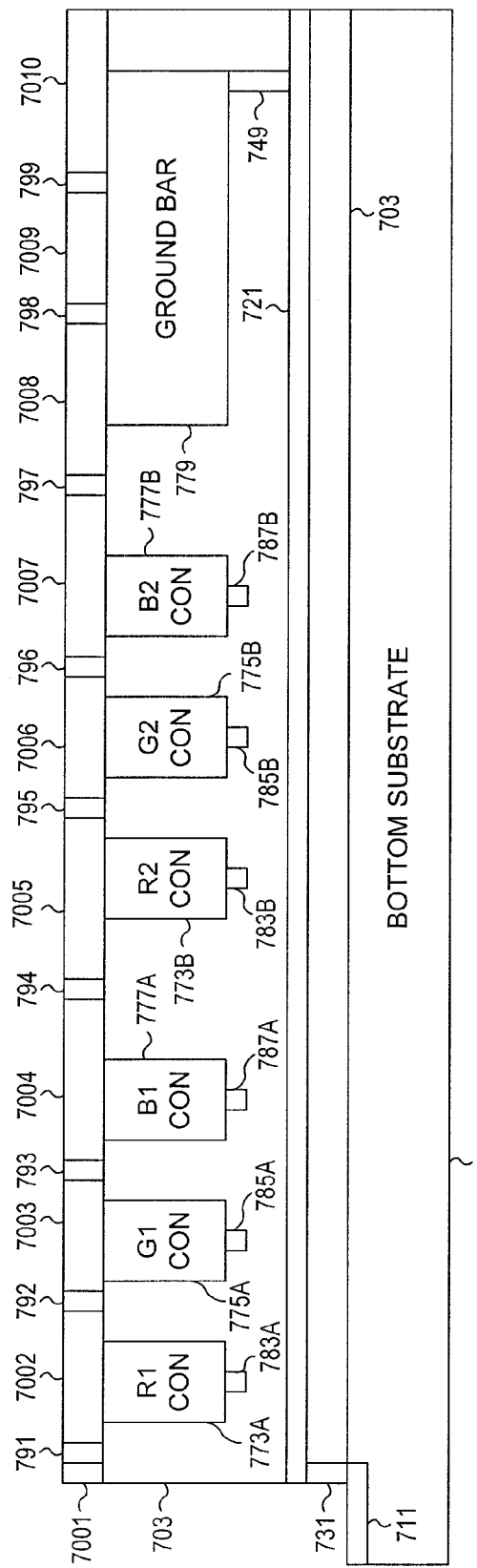
FIG. 9 is a cross-sectional view of the lighting device portion of FIG. 7 along line IX-IX' according to disclosed embodiments.

FIG. 9 is a cross-sectional view of the lighting device portion 700 of FIG. 7 along line IX-IX' according to disclosed embodiments. A basic description of the elements in this drawing has been made above with respect to FIG. 7. That description will not be repeated with respect to FIG. 9.

As shown in FIG. 9, the first red connection element 773A is located between, and electrically connects, the second conductive top substrate portion 7002 and the fourth connection line 783A; the first green connection element 775A is located between, and electrically connects, the third conductive top substrate portion 7003 and the fifth connection line 785A; and the first blue connection element 777A is located between, and electrically connects, the fourth conductive top substrate portion 7004 and the sixth connection line 787A.

Likewise, the second red connection element 773B is located between, and electrically connects, the fifth conductive top substrate portion 7005 and the seventh connection line 783B; the second green connection element 775B is located between, and electrically connects, the sixth conductive top substrate portion 7006 and the eighth connection line 785B; and the second blue connection element 777B is located between, and electrically connects, the seventh conductive top substrate portion 7007 and the ninth connection line 787B.

The eighth, ninth, and tenth conductive top substrate portions 7008, 7009, 7010 all are electrically connected to, the ground bar 779. The eighth via 749 extends through the affixing layer 703 and electrically connects to the ground line 721. The ground line 721 extends through the affixing layer 703, parallel to the bottom substrate 701 and is electrically connected to the first via 731. The first via 731 extends through the affixing layer 703 and electrically connects to the ground pad 711.

In this way, when a ground voltage is applied to the ground pad 711, the ground bar is likewise provided with the ground voltage, through the first via 731, the ground line 721, and the fourth via 749. Therefore, when the eighth, ninth, and tenth conductive top substrate portions 7008, 7009, 7010 all electrically connect to the ground bar 779, they are likewise each connected to the ground voltage.

As shown in FIG. 8, the first through ninth isolation portions 791-799 each are configured to electrically isolate adjacent conductive top substrate portions from the first through tenth conductive top substrate portions 7001-7010.

Figure 10:
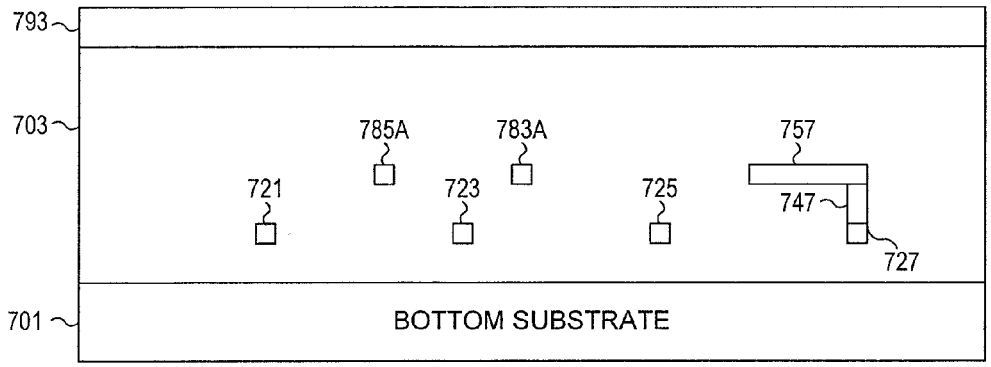
FIG. 10 is a cross-sectional view of the lighting device portion of FIG. 7 along line X-X' according to disclosed embodiments.

FIG. 10 is a cross-sectional view of the lighting device portion 700 of FIG. 7 along line X-X' according to disclosed embodiments. A basic description of the elements in this drawing has been made above with respect to FIG. 7. That description will not be repeated with respect to FIG. 10.

As shown in FIG. 10, the ground line 721 and the red, green, and blue control lines 723, 725, 727 run through the affixing layer 703, parallel to each other above the bottom substrate 701. The seventh via 747 is formed up through the affixing layer 703, and electrically connects the blue control line 727 to the third connection line 757. The third connection line 757 extends through the affixing layer 703, parallel to the surface of the bottom substrate 701, from the seventh via 747 to a point where it turns to connect with the first blue light-emitting element 767A (not shown in FIG. 10).

In addition, the fourth and fifth connection lines 783A, 785A pass through the affixing layer 703 at this spot in the lighting device 700, on their way from the first red and green connection circuits 773A, 775A, respectively to the second red and green light-emitting elements 763B, 765B, respectively.

In the cross-section of the lighting device 700 shown in FIG. 10, the third isolation portion 793 extends across the width of the bottom substrate 701.

Figure 11:
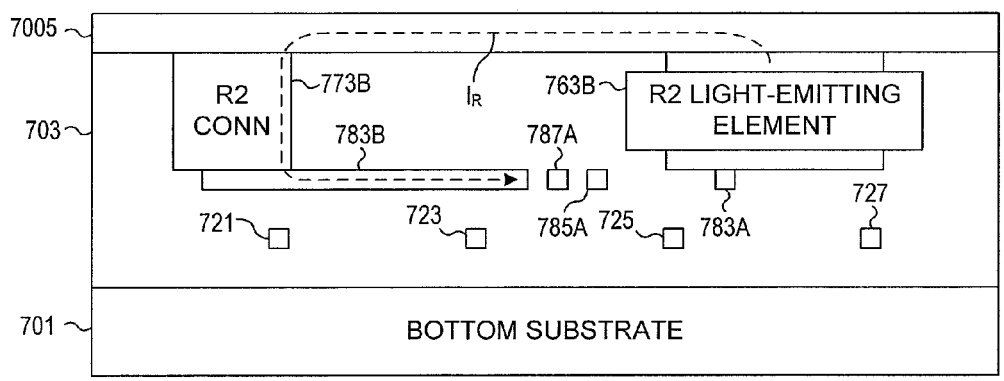
FIG. 11 is a cross-sectional view of the lighting device portion of FIG. 7 along line XI-XI' according to disclosed embodiments.

FIG. 11 is a cross-sectional view of the lighting device portion 700 of FIG. 7 along line XI-XI' according to disclosed embodiments. A basic description of the elements in this drawing has been made above with respect to FIG. 7. That description will not be repeated with respect to FIG. 11.

As shown in FIG. 11, the ground line 721 and the red, green, and blue control lines 723, 725, 727 run through the affixing layer 703, parallel to each other above the bottom substrate 701. The fourth through seventh connection lines 783A, 785A, 787A, 783B all pass through the affixing layer 703 above the ground line 721 and the red, green, and blue control lines 725, 725, 727.

The fourth connection line 783A connects to a bottom contact of the second red light-emitting element 763B. As shown in FIG. 7, the fourth connection line 783A comes to the second red light-emitting element 763B from the first red connection circuit 773A.

The fifth and sixth connection lines 785A, 787A pass through the affixing layer 703 from the first green connection circuit 775A and the first blue connection circuit 777A, respectively (both not shown in FIG. 11), on their way to the second green light-emitting element 765B and the second blue light-emitting element 767B, respectively (both not shown in FIG. 11).

The seventh connection line 783B extends through the affixing layer 703 from the second red connection circuit 773B to the third red light-emitting element 763C (not shown in FIG. 11).

The fifth conductive top substrate portion 7005 extends above the affixing layer 703, across the width of the bottom substrate 701, and is connected to both the top contact of the second red light-emitting element 763B and the top of the second red connection circuit 773B, electrically connecting these two elements.

As shown in FIG. 11, a red control current $I_R$ (i.e., a red control signal) passes from the second red light-emitting element 763B, through the fifth conductive top substrate portion 7005 to the second red connection circuit 773B, through the second red connection circuit 773B to the seventh connection line 783B, and thence to the third red light-emitting element 763C. In this way, the red control current $I_R$ (i.e., the red control signal) can pass from the string of red light-emitting elements 763A, 763B, 763C, independently of the other control signals, and in a manner where all of the red light-emitting elements 763A, 763B, 763C are controlled by the same signal. Similar connections can be shown for the green and blue light-emitting elements.

Figure 12:
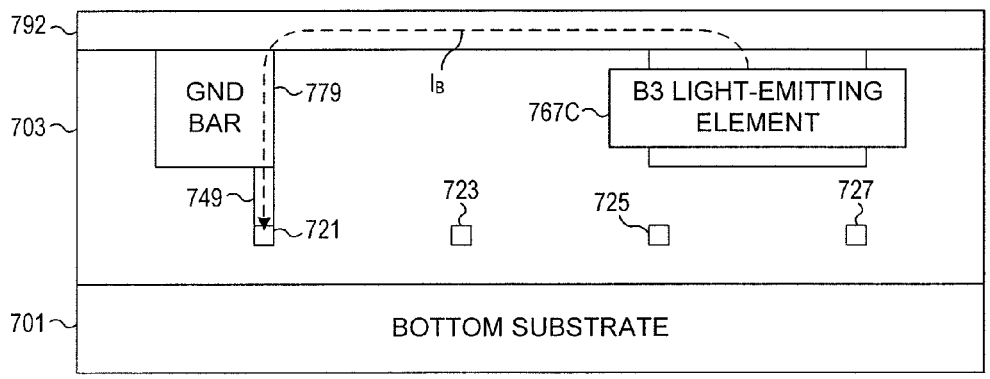
FIG. 12 is a cross-sectional view of the lighting device portion of FIG. 7 along line XII-XII' according to disclosed embodiments.

FIG. 12 is a cross-sectional view of the lighting device portion 700 of FIG. 7 along line XII-XII' according to disclosed embodiments. A basic description of the elements in this drawing has been made above with respect to FIG. 7. That description will not be repeated with respect to FIG. 12.

As shown in FIG. 12, the ground line 721 and the red, green, and blue control lines 723, 725, 727 run through the affixing layer 703, parallel to each other above the bottom substrate 701.

The tenth conductive top substrate portion 7010 extends above the affixing layer 703, across the width of the bottom substrate 701, and is connected to both the top contact of the third blue light-emitting element 767C and the top of the ground bar 779, electrically connecting these two elements.

As shown in FIG. 12, a blue control current $I_B$ (i.e., a blue control signal) passes from the third blue light-emitting element 767C, through the tenth conductive top substrate portion 7010 to the ground bar 779, through the ground bar 779 to the eighth via 749, and thence to the ground line 721. In this way, the blue control current $I_B$ (i.e., the blue control signal) can pass from the string of blue light-emitting elements 767A, 767B, 767C, and to ground, thus completing the circuit. Furthermore, the blue control signal can do this independent of the other control signals, and in a manner where all of the blue light-emitting elements 767A, 767B, 767C are controlled by the same signal. Similar connections can be shown for the red and green light-emitting elements.

Operation of the Multiple-Color Lighting Device (Second Embodiment)

The operation of the portion of the lighting device 700 of FIGS. 7-12 will now be described. Initially, a ground voltage is provided to the ground pad 711, a red control signal is provided to the red pad 713, a green control signal is provided to the green pad 715, and a blue control signal is provided to the blue pad 717. This can be done by connecting external wires or the like to the respective pads 711, 713, 715, 717. This is possible because the pads 711, 713, 715, 717 are exposed by the pad gap in the affixing layer 703 and the first conductive top substrate portion 7001.

The ground voltage passes from the ground pad 711 through the first via 731 to the ground line 721, through the ground line 721 to the eighth via 749, and through the eighth via 749 to the ground bar 779. In this way, the ground bar is provided with a ground voltage.

The red control signal passes from the red pad 713 through the second via 733 to the main portion 723A of the red control line 723, from the main portion 723A of the red control line 723 to the side portion 723B of the red control line 723, from the side portion 723B of the red control line 723 to the fifth via 743, through the fifth via 743 to the first connection line 753, and through the first connection line 753 to the first red light-emitting element 763A at a lower contact.

The first red light-emitting element 763A then emits red light in accordance with the red control signal. The first red light-emitting element 763A also passes the red control signal to an upper contact, where the red control signal passes from the first red light-emitting element 763A to the second conductive top substrate portion 7002, through the second conductive top substrate portions 7002 to the top of the first red connection circuit 773A, through the first red connection circuit 773A to the fourth connection line 783A, and from the fourth connection line 783A to the second red light-emitting element 763B at a lower contact.

The second red light-emitting element 763B then emits red light in accordance with the red control signal. The second red light-emitting element 763B also passes the red control signal to an upper contact, where the red control signal passes from the second red light-emitting element 763B to the fifth conductive top substrate portion 7005, through the fifth conductive top substrate portions 7005 to the top of the second red connection circuit 773B, through the second red connection circuit 773B to the seventh connection line 783B, and from the seventh connection line 783B to the third red light-emitting element 763C.

The third red light-emitting element 763C then emits red light in accordance with the red control signal. The third red light-emitting element 763C also passes the red control signal to an upper contact, where the red control signal passes from the third red light-emitting element 763C to the eighth conductive top substrate portion 7008, through the eighth conductive top substrate portions 7008 to the top of the ground bar 779, which, as noted above, is provided with a ground voltage.

In this way, the red control signal that is provided at the red pad 713 controls the operation of all three of the red light-emitting elements 763A, 763B, 763C. Furthermore, the disclosed portion of the lighting element 700 provides a proper circuit path for the red control signal, from the red pad 713, through each of the red light-emitting element 763A, 763B, 763C, to the ground pad 711.

Likewise, the green control signal passes from the green pad 715 through the third via 735 to the green control line 725, from the green control line 725 to the sixth via 745, through the sixth via 745 to the second connection line 755, and through the second connection line 755 to the first green light-emitting element 765A at a lower contact.

The first green light-emitting element 765A then emits green light in accordance with the green control signal. The first green light-emitting element 765A also passes the green control signal to an upper contact, where the green control signal passes from the first green light-emitting element 765A to the third conductive top substrate portion 7003, through the third conductive top substrate portions 7003 to the top of the first green connection circuit 775A, through the first green connection circuit 775A to the fifth connection line 785A, and from the fifth connection line 785A to the second green light-emitting element 765B.

The second green light-emitting element 765B then emits green light in accordance with the green control signal. The second green light-emitting element 765B also passes the green control signal to an upper contact, where the green control signal passes from the second green light-emitting element 765B to the sixth conductive top substrate portion 7006, through the sixth conductive top substrate portions 7006 to the top of the second green connection circuit 775B, through the second green connection circuit 775B to the eighth connection line 785B, and from the eighth connection line 785B to the third green light-emitting element 765C.

The third green light-emitting element 765C then emits green light in accordance with the green control signal. The third green light-emitting element 765C also passes the green control signal to an upper contact, where the green control signal passes from the third green light-emitting element 765C to the ninth conductive top substrate portion 7009, through the ninth conductive top substrate portions 7009 to the top of the ground bar 779, which, as noted above, is provided with a ground voltage.

In this way, the green control signal that is provided at the green pad 715 controls the operation of all three of the green light-emitting elements 765A, 765B, 765C. Furthermore, the disclosed portion of the lighting element 700 provides a proper circuit path for the green control signal, from the green pad 715, through each of the green light-emitting element 765A, 765B, 765C, to the ground pad 711.

Finally, the blue control signal passes from the blue pad 717 through the fourth via 737 to the blue control line 727, from the blue control line 727 to the seventh via 747, through the seventh via 747 to the third connection line 757, and through the third connection line 757 to the first blue light-emitting element 767A at a lower contact.

The first blue light-emitting element 767A then emits blue light in accordance with the blue control signal. The first blue light-emitting element 767A also passes the blue control signal to an upper contact, where the blue control signal passes from the first blue light-emitting element 767A to the fourth conductive top substrate portion 7004, through the fourth conductive top substrate portions 7004 to the top of the first blue connection circuit 777A, through the first blue connection circuit 777A to the sixth connection line 787A, and from the sixth connection line 787A to the second blue light-emitting element 767B.

The second blue light-emitting element 767B then emits blue light in accordance with the blue control signal. The second blue light-emitting element 767B also passes the blue control signal to an upper contact, where the blue control signal passes from the second blue light-emitting element 767B to the seventh conductive top substrate portion 7007, through the seventh conductive top substrate portions 7007 to the top of the second blue connection circuit 777B, through the second blue connection circuit 777B to the ninth connection line 787B, and from the ninth connection line 787B to the third blue light-emitting element 767C.

The blue green light-emitting element 767C then emits blue light in accordance with the blue control signal. The third blue light-emitting element 767C also passes the blue control signal to an upper contact, where the blue control signal passes from the third blue light-emitting element 767C to the tenth conductive top substrate portion 7010, through the tenth conductive top substrate portions 7010 to the top of the ground bar 779, which, as noted above, is provided with a ground voltage.

In this way, the blue control signal that is provided at the blue pad 717 controls the operation of all three of the blue light-emitting elements 767A, 767B, 767C. Furthermore, the disclosed portion of the lighting element 700 provides a proper circuit path for the blue control signal, from the blue pad 717, through each of the blue light-emitting element 767A, 767B, 767C, to the ground pad 711.

Equivalent Circuits

Figure 13:
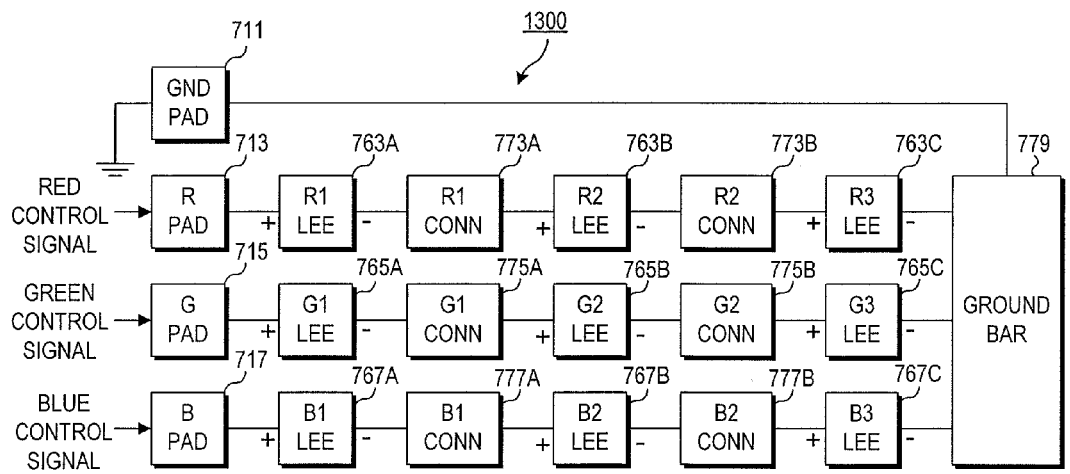
FIG. 13 is a block diagram of an equivalent circuit of the lighting device portion of FIG. 7 according to disclosed embodiments.

FIG. 13 is a block diagram of an equivalent circuit of the lighting device portion of FIG. 7 according to disclosed embodiments. For simplicity of disclosure, this drawing shows the ground line 721, the red, green, and blue control signal lines 723, 725, 727, the connection lines 753, 755, 757, 783A, 785A, 787A, 783B, 785B, 787B, the vias 731, 733, 735, 737, 743, 745, 747, 749, and the conductive top substrate portions 7002-7010 all as simple lines connecting circuit elements.

As shown in FIG. 13, in the equivalent circuit 1300, a red control signal, a green control signal, and a blue control signal are provided to a red pad 713, a green pad 715, and a blue pad 717, respectively. The ground pad 711 is connected to the ground voltage. Each of the control signals passes from a respective input pad, through three light-emitting elements of the same color, and to the ground pad, completing the circuit.

The red control signal is provided to the red pad 713 and passes, in turn, through the first red light-emitting element 763A, the first red connection circuit 773A, the second red light-emitting element 763B, the second red connection circuit 773B, the third red light-emitting element 763C, the ground bar 779, and the ground pad 711.

Likewise, the green control signal is provided to the green pad 715 and passes, in turn, through the first green light-emitting element 765A, the first green connection circuit 775A, the second green light-emitting element 765B, the second green connection circuit 775B, the third green light-emitting element 765C, the ground bar 779, and the ground pad 711.

Finally, the blue control signal is provided to the blue pad 717 and passes, in turn, through the first blue light-emitting element 767A, the first blue connection circuit 777A, the second blue light-emitting element 767B, the second blue connection circuit 777B, the third blue light-emitting element 767C, the ground bar 779, and the ground pad 711.

Although the actual connections within the lighting device portion 700 includes twists and turns, using a combination of lines, vias, and conductive top substrate portions to connect the various elements, the connections can be simplified to the circuit shown in FIG. 13.

As noted above, this circuit design allows a set of light-emitting elements of a given color to be controlled in unison by a single control signal furthermore the various control signals provided can be controlled independently of each other.

FIG. 14 is a circuit diagram 1400 of an equivalent circuit of the lighting device portion 700 of FIG. 7 according to disclosed embodiments. This circuit diagram reduces the description of the lighting device portion 700 to its simplest form. In addition, the circuit diagram of FIG. 14 also shows how the red, green, and blue control signals are provided to the lighting device portion 700.

As shown in FIG. 14, a red voltage supply $V_R$ and a red input resistor $R_R$ operate together to provide the red control signal. This red control signal is passed through the red pad 713 to a first red light-emitting element 763A, a second red light-emitting element 763B, and a third red light-emitting element 763C, in series, and then through the ground pad 711 to a ground voltage.

Similarly, a green voltage supply $V_G$ and a green input resistor $R_G$ operate together to provide the green control signal. This green control signal is passed through the green pad 715 to a first green light-emitting element 765A, a second green light-emitting element 765B, and a third green light-emitting element 765C, in series, and then through the ground pad 711 to a ground voltage.

Likewise, a blue voltage supply $V_B$ and a blue input resistor $R_B$ operate together to provide the blue control signal. This blue control signal is passed through the blue pad 717 to a first blue light-emitting element 767A, a second blue light-emitting element 767B, and a third blue light-emitting element 767C, in series, and then through the ground pad 711 to a ground voltage.

As with the equivalent block diagram of FIG. 13, the equivalent circuit diagram 1400 shows that each string of same-colored light-emitting elements is controlled by a single control signal, and that each control signal can be operated independently of the other control signals.

In addition, FIG. 14 shows that from an electrical standpoint, it is the light-emitting elements where the primary voltage drops will occur. In the disclosed embodiments, the light-emitting elements are arranged such that the voltage drop across each light-emitting element is sufficient to activate that light-emitting element. For example, if $V_R$ is 12 V, the total voltage drop across the three red light-emitting elements 763A, 763B, 763C will be 12 V. The three red light-emitting elements 763A, 763B, 763C should be designed such that the portion of the 12 V that drops across each red light-emitting element 763A, 763B, 763C is sufficient to cause that light-emitting element to generate light. One possible implementation of this is to have each of the red light-emitting elements 763A, 763B, 763C have the same voltage drop across it. Therefore, the drop across each of the three red light-emitting elements 763A, 763B, 763C will be one-third of 12 V, or 4 V. In such an embodiment, the red voltage $V_R$ need only be set to be at least three times the required voltage drop across one of the red light-emitting elements r 763A, 763B, 763C. A similar analysis can be performed for the green and blue light-emitting elements. Similarly, a similar analysis can be performed if fewer or more light-emitting elements are used in a given current path.

Furthermore, as noted above, although the embodiments of FIGS. 7-14 disclose the use of three colors in the lighting device portion 700, this is by way of example only. Two colors or four or more colors could also be used in alternate embodiments. Likewise, although the embodiments of FIGS. 7-14 specifically disclose red, green, and blue light-emitting elements, this is also by way of example. Different colored light-emitting elements can be used in alternate embodiments, including light that is not visible to the naked eye (e.g., infrared light).

In addition, although the embodiments of FIGS. 7-14 disclose that the set of light-emitting elements controlled by each individual control signal emit light of a different color from all of the other sets of light-emitting elements, this too is by way of example only. In alternate embodiments it may be desirable to separately control different groups of light-emitting elements that transmit light of the same color. The circuit described above can be used in such embodiments.

Method of Manufacture

Figure 15:
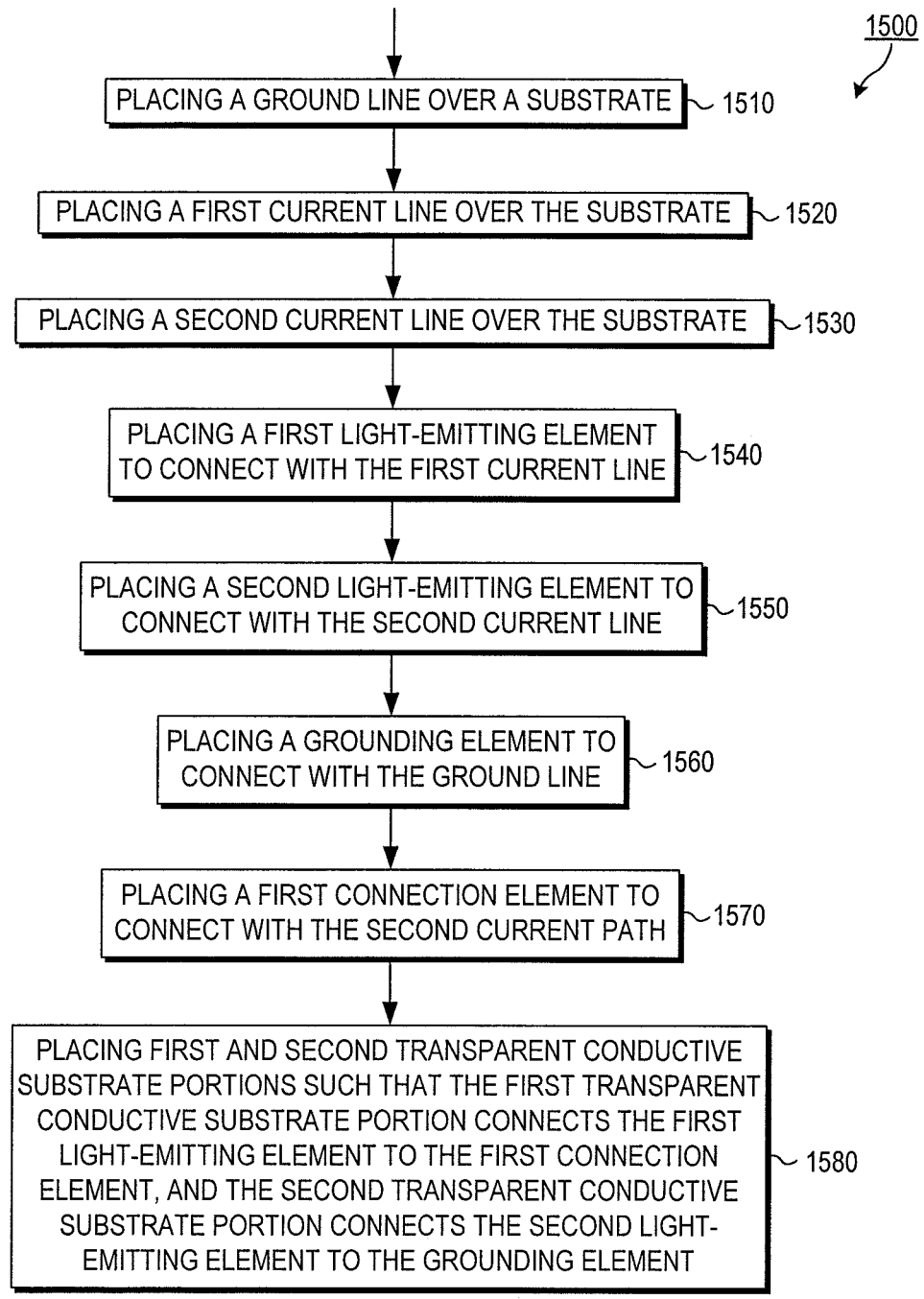
FIG. 15 is a flow chart showing a method of manufacturing a multiple-color lighting device according to disclosed embodiments.

FIG. 15 is a flow chart showing a method 1500 of manufacturing a multiple-color lighting device according to disclosed embodiments. As shown in FIG. 15, the manufacturing method begins by placing a ground path over a substrate (1510).

A first current path is then placed over the substrate (1520), and a second current path is placed over the substrate (1530).

A first light-emitting element is then placed such that it is electrically connected to the first current path (1540). Likewise, second light-emitting element is placed such that it is electrically connected to the second current path (1550).

A grounding element is placed such that it is electrically connected to the ground path (1560).

A first connection element is placed such that it is electrically connected to the second current path (1570).

Finally, first and second transparent conductive substrates are formed such that the first transparent conductive substrate portion electrically connects the first light emitting element to the first connection element, and such that the second transparent conductive substrate portion electrically connects the second light-emitting element to the grounding element (1580).

In this way, a current path for a control signal will be created from the first current path, through the first and second light-emitting elements, to the ground path. In particular, the first current path is connected to the first light-emitting element, from the first light-emitting element to the first transparent conductive substrate portion, from the first transparent conductive substrate portion to the first connection element, from the first connection element to the second current path, from the second current path to the second light-emitting element, from the second light-emitting element to the second transparent conductive substrate portion, from the second transparent substrate portion to the grounding element, and from the grounding element to the ground path.

FIG. 16 is a flow chart describing the operation of placing the first and second transparent conductive substrate portions (1580) of the method of FIG. 15 according to first disclosed embodiments.

As shown in FIG. 16, in the first disclosed embodiments, a base conductive substrate is formed over a first light-emitting element, a first connection element, a second light-emitting element, and a grounding element, such that the base conductive substrate is electrically connected to the first light-emitting element, the first connection element, the second light-emitting element, and the grounding element (1610).

Then, a gap is cut in the base transparent conductive substrate to form a first conductive substrate portion and a second conductive substrate portion, separated by an insulating gap (1620). In various embodiments, this gap can be filled with an insulating substance.

FIG. 17 is a flow chart describing the operation of placing the first and second transparent conductive substrate portions (1580) of the method of FIG. 15 according to second disclosed embodiments.

As shown in FIG. 17, in the second disclosed embodiments, a first transparent conductive substrate portion is placed over the first light-emitting element and the first connection element, such that it electrically connects the first light-emitting element to the first connection element (1580).

Then, a second transparent conductive substrate portion is placed over the second light-emitting element and the grounding element, such that it electrically connects the second light-emitting element to the grounding element (1590).

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A variable-color light-emitting structure, comprising:
a ground path connected to a ground voltage;
a first current path configured to receive and pass a first control current;
a first light-emitting element connected to the first current path, configured to receive the first control current from the first current path, configured to generate light within a first wavelength range based on the received first control current, and configured to pass the first control current;

a first conductive substrate portion formed over the first light-emitting element, and electrically connected to the first light-emitting element, the first conductive substrate being configured to receive and pass the first control current from the first light-emitting element;

a first connection element, having a first upper contact and a first lower contact, the first connection element being configured to receive the first control current from the first conductive substrate, and to pass the first control current from the first upper contact to the first lower contact;

a second current path configured to receive and pass the first control current from the first connection element;

a second light-emitting element being electrically connected to the second current path, being configured to receive the first control current from the second current path, being configured to generate light within the first wavelength range based on the received first control current, and configured to pass the first control current;

a second conductive substrate portion formed over the second light-emitting element, and electrically connected to the second light-emitting element, the second conductive substrate being configured to receive and pass the first control current; and a grounding element electrically connected between the second conductive substrate portion and the ground path, the grounding element being configured to receive the first control current from the second substrate portion, and to pass the first control current to the ground path.

2. The variable-color light-emitting structure of claim 1, wherein
the first and second conductive substrate portions are both substantially transparent the first wavelength range.

3. The variable-color light-emitting structure of claim 1, wherein
a first voltage drop across the first light-emitting element is sufficient to cause the first light-emitting element to emit light in the first wavelength range, and
a second voltage drop across the second light-emitting element is sufficient to cause the second light-emitting element to emit light in the first wavelength range.

4. The variable-color light-emitting structure of claim 1, wherein
the first current path is electrically connected to a first pad, and is configured to receive the first control current from the first pad.

5. The variable-color light-emitting structure of claim 1, wherein
the first wavelength range produces one of red, green, blue and yellow light.

6. The variable-color light-emitting structure of claim 1, wherein
the first and second light-emitting elements are light-emitting diodes.

7. The variable-color light-emitting structure of claim 1, wherein
the first and second conductive substrate portions are separated by a non-conductive material.

8. The variable-color light-emitting structure of claim 1, further comprising:
a third current path configured to receive and pass the first control current;
a third light-emitting element being electrically connected to the third current path, being configured to receive the first control current from the third current path, being configured to generate light within the first wavelength range based on the received first control current;

a third conductive substrate portion formed over the third light-emitting element, and electrically connected to the third cathode, the third conductive substrate being configured to receive and pass the first control current from the third cathode; and a third connection element, having a third upper contact and a third lower contact, the third lower contact being electrically connected to the first current path, the third connection element being configured to receive the first control current from the third conductive substrate, and to pass the first control current from the first upper contact to the first current path, through the first lower contact.

9. The variable-color light-emitting structure of claim 8, further comprising:
a fourth current path configured to receive and pass a second control current;
a fourth light-emitting element having a fourth anode and a fourth cathode, the fourth anode being electrically connected to the fourth current path and configured to receive the second control current from the fourth current path, the fourth light-emitting element being configured to generate light within a second wavelength range, different from the first wavelength range, based on the second control current received at the fourth anode, and to pass the second control current from the fourth anode to the fourth cathode;

a fourth conductive substrate portion formed over the fourth light-emitting element, and electrically connected to the fourth cathode, the fourth conductive substrate being configured to receive and pass the second control current from the fourth cathode;

a fourth connection element configured to receive and pass the second control current from the fourth conductive substrate;

a fifth current path configured to receive and pass the second control current from the fourth connection element;

a fifth light-emitting element having a fifth anode and a fifth cathode, the fifth anode being electrically connected to the fifth current path and configured to receive the second control current from the fifth current path, the fifth light-emitting element being configured to generate light within the second wavelength range based on the second control current received at the fifth anode, and to pass the second control current from the fifth anode to the fifth cathode;

a fifth conductive substrate portion formed over the fifth light-emitting element, and electrically connected to the fifth cathode, the fifth conductive substrate being configured to receive and pass the second control current from the fifth cathode; and a grounding element electrically connected between the fifth conductive substrate portion and ground, the grounding element being configured to receive the second control current from the fifth substrate portion, and to pass the second control current to ground.

10. The variable-color light-emitting structure of claim 9, wherein
the first, second, fourth, and fifth light-emitting elements are light-emitting diodes.

11. The variable-color light-emitting structure of claim 9, wherein
the second wavelength range produces one of red, green, blue and yellow light.

12. The variable-color light-emitting structure of claim 9, further comprising:
- a sixth current path configured to receive and pass the second control current;
- a sixth light-emitting element having a sixth anode and a sixth cathode, the sixth anode being electrically connected to the sixth current path and configured to receive the second control current from the sixth current path, the sixth light-emitting element being configured to generate light within the second wavelength range based on the second control current received at the sixth anode, and to pass the second control current from the sixth anode to the sixth cathode;
- a sixth conductive substrate portion formed over the sixth light-emitting element, and electrically connected to the sixth cathode, the sixth conductive substrate being configured to receive and pass the second control current from the sixth cathode; and
- a sixth connection element configured to receive and pass the second control current from the sixth conductive substrate to the fourth current path.

13. A method of forming a variable-color light-emitting structure, comprising:
- placing a ground path over a substrate, such that the ground path is electrically connected to a ground voltage;
- placing a first current path over the substrate;
- placing a second current path over the substrate;
- placing a first light-emitting element over the first current path such that the light-emitting element is electrically connected to the first current path, the first light-emitting element is configured to generate light within a first wavelength range based on a first control current, and to pass the first control current;
- placing a second light-emitting element over the second current path, such that the second light-emitting element is electrically connected to the second current path, the second light-emitting element being configured to generate light within the first wavelength range based on the first control current, and to pass the first control current;
- placing a grounding element having a first upper contact electrically connected to a lower contact over the ground path, such that the lower contact is electrically connected to the ground path;
- placing a first connection element, having a first upper contact and a first lower contact, over the second current path, such that the first lower contact is electrically connected to the second current path, the first connection element being configured to pass the first control current from the first upper contact to the first lower contact;
- placing a first conductive substrate portion over the first light-emitting element and the first connection element, such that the first conductive substrate portion electrically connects the first light-emitting element to the first upper contact; and
- placing a second conductive substrate portion over the second light-emitting element and the grounding element, such that the second conductive substrate portion electrically connects the second light-emitting element to the first upper contact.

14. The method of claim 13, wherein the operations of placing the first conductive substrate portion and placing the second conductive substrate portion comprises:
- placing a base conductive substrate over the first light-emitting element, the first connection element, the second light-emitting element, and the grounding element; and
- cutting a gap in the base conductive substrate such that a first portion of the base conductive substrate forms the first conductive substrate portion, a second portion of the base conductive substrate forms the second conductive substrate portion, and the first and second conductive substrate portions are electrically isolated from each other.

15. The method of claim 13, wherein
the first current path is electrically connected to a first pad, and is configured to receive the first control current from the first pad.

16. The method of claim 13, wherein
the first wavelength range produces one of red, green, blue and yellow light.

17. The method of claim 13, wherein
the first and second light-emitting elements are light-emitting diodes.

18. The method of claim 13, wherein
the second conductive substrate portion is placed such that it is separated from the first conductive substrate portion by a non-conductive material.

19. The method of claim 13, further comprising:
- placing a third current path over the substrate;
- placing a third light-emitting element over the third current path, such that the third light-emitting element is electrically connected to the third current path, the third light-emitting element being configured to generate light within the first wavelength range based on the first control current, and to pass the first control current;
- placing a third connection element, having a third upper contact and a third lower contact, over the first current path, such that the third lower contact is electrically connected to the first current path, the third connection element being configured to pass the first control current from the third upper contact to the third lower contact; and
- placing a third conductive substrate portion over the third light-emitting element and the third connection element, such that the third conductive substrate portion electrically connects the third light-emitting element to the third upper contact,
- wherein the third current path is electrically connected to the first light-emitting element.

20. The method of claim 13, further comprising:
- placing a fourth current path over the substrate;
- placing a fifth current path over the substrate;
- placing a fourth light-emitting element over the fourth current path, such that the fourth light-emitting element is electrically connected to the fourth current path, the fourth light-emitting element is configured to generate light within a second wavelength range based on a second control current received at the fourth anode, and to pass the second control current from the fourth anode to the fourth cathode;
- placing a fifth light-emitting element, having a fifth anode and a fifth cathode, over the fifth current path, such that the fifth anode is electrically connected to the fifth current path, the fifth light-emitting element being configured to generate light within the second wavelength range based on the second control current received at the fifth anode, and to pass the second control current from the fifth anode to the fifth cathode;
- placing a fourth connection element, having a fourth upper contact and a fourth lower contact, over the fifth current path, such that the fourth lower contact is electrically connected to the fifth current path, the fourth connection element being configured to pass the second control current from the fourth upper contact to the fourth lower contact;

placing a fourth conductive substrate portion over the fourth light-emitting element and the fourth connection element, such that the fourth conductive substrate portion electrically connects the fourth cathode to the fourth upper contact; and placing a fifth conductive substrate portion over the fifth light-emitting element and the grounding element, such that the fifth conductive substrate portion electrically connects the fifth cathode to a second upper contact of the grounding element, the second upper contact being electrically connected to the lower contact.

* * * * *